(12) United States Patent
Taniguchi et al.

(10) Patent No.: US 9,082,749 B2
(45) Date of Patent: Jul. 14, 2015

(54) SEMICONDUCTOR DEVICE AND METHOD OF MANUFACTURING THE SEMICONDUCTOR DEVICE

(71) Applicant: Sony Corporation, Tokyo (JP)

(72) Inventors: Satoshi Taniguchi, Kanagawa (JP); Katsuhiko Takeuchi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 28 days.

(21) Appl. No.: 14/087,310

(22) Filed: Nov. 22, 2013

(65) Prior Publication Data
US 2014/0159117 A1 Jun. 12, 2014

(30) Foreign Application Priority Data
Dec. 7, 2012 (JP) .................................. 2012-268315

(51) Int. Cl.
*H01L 29/66* (2006.01)
*H01L 29/423* (2006.01)
*H01L 29/778* (2006.01)
*H01L 29/10* (2006.01)

(52) U.S. Cl.
CPC ........ *H01L 29/4232* (2013.01); *H01L 29/1079* (2013.01); *H01L 29/42364* (2013.01); *H01L 29/66462* (2013.01); *H01L 29/7783* (2013.01); *H01L 29/7786* (2013.01)

(58) Field of Classification Search
CPC ............ H01L 29/7783; H01L 29/7786; H01L 29/1079; H01L 29/4232; H01L 29/42364; H01L 29/66462
USPC ........................... 257/194, 196; 438/172, 936
See application file for complete search history.

(56) References Cited

U.S. PATENT DOCUMENTS 6,365,925 B2 4/2002 Hase et al.

FOREIGN PATENT DOCUMENTS

JP HEI 11-150264 6/1999
JP 2009-71270 4/2009

*Primary Examiner* — Tan N Tran
(74) *Attorney, Agent, or Firm* — Dentons US LLP

(57) ABSTRACT

A semiconductor device includes a channel layer; and a high resistance layer that is provided on the channel layer, and is made of a semiconductor with high resistance which has a conduction band position higher than that of the semiconductor which forms the channel layer. The semiconductor device includes a first conduction-type low resistance region provided on a surface layer of the high resistance layer, and is made of a semiconductor including first conduction type impurities. The semiconductor device includes: a source electrode and a drain electrode that are connected to the high resistance layer, in a position crossing the low resistance region; a gate insulating film provided on the low resistance region; and a gate electrode provided on the low resistance region via the gate insulating film. The semiconductor device includes current block regions between the low resistance region, and between the source electrode and the drain electrode respectively.

11 Claims, 13 Drawing Sheets

SEMICONDUCTOR DEVICE AND METHOD OF MANUFACTURING THE SEMICONDUCTOR DEVICE

CROSS REFERENCE TO RELATED APPLICATIONS

This application claims the benefit of Japanese Priority Patent Application JP 2012-268315 filed Dec. 7, 2012, the entire contents of which are incorporated herein by reference.

BACKGROUND

The present disclosure relates to a semiconductor device and a method of manufacturing the semiconductor device, particularly to the semiconductor device that includes a low resistance region in a barrier layer between a gate electrode and a channel layer, and the method of manufacturing the same.

In recent years, in a mobile communication system such as a mobile phone, it has been necessary to miniaturize the size and reduce the power consumption in the mobile communication terminal. In order to realize those demands, for example, a reduction of ON resistance Ron is necessary with regard to an antenna switch.

As a semiconductor device that has been in practical use for that antenna switch, a junction-type field effect transistor (JPHEMT; Junction Pseudomorphic High Electron Mobility Transistor) is disclosed (see, for example, Japanese Unexamined Patent Application Publication No. 11-150264).

In addition, a MIS gate structure type HEMT device which performs a current modulation using: a metal insulator semiconductor (MIS) inversion layer formed using group III nitride materials such as AlGaN/GaN, or AlInN/GaN; and a hetero junction is disclosed (see, for example, Japanese Unexamined Patent Application Publication No. 2009-71270).

Each semiconductor device described above has a structure in which a gate electrode is provided between a source electrode and a drain electrode, and a current flowing between the source electrode and the drain electrode can be modulated. Then, each semiconductor device has only one channel through which carriers are traveling together, and the performance of the transistor is determined by transportation characteristics in the channel.

SUMMARY

However, in the JPHEMT described above, since the gate current increases due to a forward direction voltage applied to the gate electrode, the forward voltage that can be applied to the gate electrode is limited. In addition, in the MIS gate structure type GaN HEMT device, the mobility is lower compared to the JPHEMT described above, and the GaN HEMT device is not suitable for a high-frequency operation. Therefore, each semiconductor device described above has structural problems.

Therefore, it is desirable to provide a semiconductor device in which the high positive voltage can be applied to the gate electrode while retaining a high mobility. Furthermore, it is desirable to improve switching characteristics in the semiconductor device.

The present disclosure provides a semiconductor device which has excellent switching characteristics and a method of manufacturing the semiconductor device.

A semiconductor device according to an embodiment of the present disclosure includes: a channel layer; and a high resistance layer that is provided on the channel layer, and is made of a semiconductor with high resistance which has a conduction band position higher than that of a semiconductor which forms the channel layer. In addition, the semiconductor device according to the embodiment of the present disclosure includes a first conduction-type low resistance region that is provided on a surface layer of the high resistance layer, and is made of a semiconductor which includes first conduction-type impurities. Then, the semiconductor device according to the embodiment of the present disclosure includes: a source electrode and a drain electrode that are connected to the high resistance layer, in a position with the low resistance region interposed therebetween; a gate insulating film provided on the low resistance region; and a gate electrode provided on the high resistance layer via the gate insulating film. The semiconductor device includes current block regions between the low resistance region and the source electrode, and between the low resistance region and the drain electrode.

In addition, a semiconductor device according to another embodiment of the present disclosure includes: a channel layer; and a high resistance layer that is provided on the channel layer, and is made of a semiconductor with high resistance which has a conduction band position higher than that of a semiconductor which forms the channel layer. In addition, the semiconductor device according to the embodiment of the present disclosure includes: a source electrode and a drain electrode that are connected to the high resistance layer; the gate insulating film provided on the high resistance layer; and a gate electrode provided on the high resistance layer between the source electrode and the drain electrode via the gate insulating film. In addition, the semiconductor device includes current block regions between the source electrode and the drain electrode except the position directly under the gate electrode.

In addition, a method of manufacturing a semiconductor device according to still another embodiment of the present disclosure includes: forming, on the channel layer, a high resistance layer that is made of a semiconductor with high resistance which has a conduction band position higher than that of a semiconductor which forms the channel layer; and forming, on a surface layer of the high resistance layer, a first conduction type low resistance region that is made of the semiconductor which includes a first conduction type impurities. Then, the method of manufacturing the semiconductor device according to the embodiment of the present disclosure further includes: forming a source electrode and a drain electrode that are connected to the high resistance layer in a position crossing a low resistance region; forming a gate insulating film on the low resistance region; and forming a gate electrode on the low resistance region via the gate insulating film. In addition, in the semiconductor device, current block regions are formed between the low resistance region and the source electrode, and between the low resistance region and the drain electrode.

In addition, a method of manufacturing the semiconductor device according to still another embodiment of the present disclosure includes forming, on the channel layer, the high resistance layer that is made of the semiconductor with high resistance which has the conduction band position higher than that of the semiconductor which forms the channel layer. Then, the method of manufacturing the semiconductor device according to the embodiment of the present disclosure includes: forming the source electrode and the drain electrode that are connected to the high resistance layer; forming the gate insulating film on the high resistance region; and forming the gate electrode on the high resistance layer between the source electrode and the drain electrode via the gate insulating film. In addition, in the semiconductor device, the current block regions are formed between the source electrode and drain electrode except directly under the gate electrode.

According to the semiconductor device and the method of manufacturing the semiconductor device, the gate insulating film is formed between the gate electrode and the semiconductor layer, and the current block regions are provided between the source electrode and the gate electrode, and between the drain electrode and the gate electrode. For this reason, the gate leakage current when the voltage is applied to the gate electrode can be suppressed, and a high forward voltage can be applied to the gate electrode. In addition, even in a case where the inversion layer is formed in the MIS portion under the gate electrode by providing the current block regions, since the current does not flow in the inversion layer where the mobility is lower than the channel layer, the unnecessary gate voltage dependence of the transfer conductance can be avoided, and it is possible to improve the switching characteristics of the semiconductor device.

According to the embodiments of the present disclosure, by suppressing the current in the interface between the gate insulating film and the semiconductor layer, it is possible to improve the switching characteristics of the semiconductor device.

DETAILED DESCRIPTION OF EMBODIMENTS

Hereinafter, examples of the best modes for implementing the present disclosure will be described. However, the present disclosure is not limited to the examples described below.

The embodiments will be described in the following order.
1. Overview of a semiconductor device
2. First embodiment (semiconductor device)
3. First embodiment (method of manufacturing the semiconductor device)
4. Second embodiment (semiconductor device)
5. Third embodiment (semiconductor device)
6. Fourth embodiment (semiconductor device)
7. Fifth embodiment (semiconductor device)
8. Sixth embodiment (semiconductor device)
9. Seventh embodiment (semiconductor device)
10. Eighth embodiment (semiconductor device)
11. Ninth embodiment (semiconductor device)
12. Tenth embodiment (semiconductor device)
13. Eleventh embodiment (semiconductor device)
14. Twelfth embodiment (semiconductor device)
15. Thirteenth embodiment (semiconductor device)

1. Overview of a Semiconductor Device

JPHEMT

Figure 24:
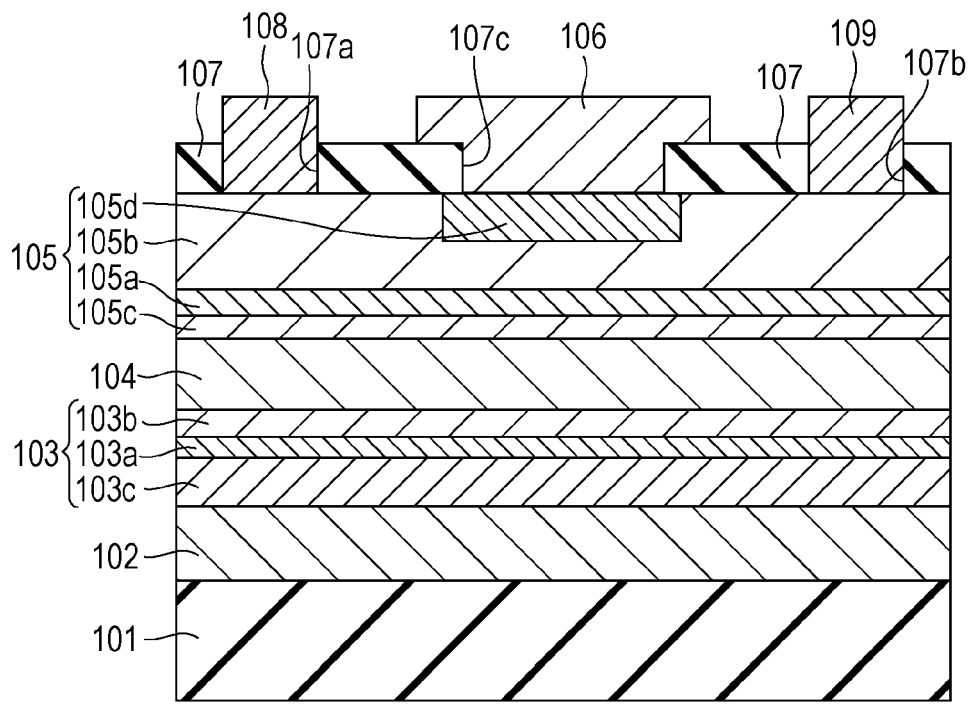
FIG. 24 is a diagram illustrating a configuration of a semiconductor device having a JPHEMT structure.

A junction-type field effect transistor (JPHEMT; Junction-gate Pseudomorphic High Electron Mobility Transistor) described above is a semiconductor device that performs a current modulation using a pn junction and a hetero junction. In FIG. 24, an example of a configuration of the JPHEMT is illustrated.

In the JPHEMT illustrated in FIG. 24, for example, a second barrier layer 103 and a channel layer 104, and a first barrier layer 105 are deposited in this order on a semi-insulating single crystal GaAs substrate 101 via a buffer layer 102 made of GaAs.

The second barrier layers 103 has a structure in which a carrier supply layer 103a is interposed between two layers of high resistance layers 103b and 103c. In addition, the first barrier layer 105 has a structure in which a carrier supply layer 105a is interposed between two layers of high resistance layers 105b and 105c. Furthermore, in the first barrier layer 105, a p-type low resistance region 105d is formed on the high resistance layer 105b which is the upper layer.

A gate electrode 106 is formed on the p-type low resistance region 105d. A source electrode 108 and a drain electrode 109 are formed on the barrier layer 105 on both sides of the p-type low resistance region 105d and the gate electrode 106 respectively.

The semiconductor device having this configuration, for example, includes a hetero-junction between the channel layer 104 that is made of InGaAs, and each of the barrier layers 103 and 105 that are made of AlGaAs and have a wider band gap than the channel layer 104 has. In addition, each of the barrier layers 103 and 105 includes carrier supply layers 103a and 105a that include impurities which are donor.

In the semiconductor device having a configuration described above, a two-dimensional electron gas layer is formed in which electrons that are carriers are confined with a high density into the interface of the barrier layers 103 and 105 in the channel layer 104. Then, by applying a voltage to the gate electrode 106 and controlling the density of the two-dimensional electron gas layer using the pn junction made of the p-type low resistance region 105d and the high resistance layer 105b, the current flowing between the source electrode 108 and drain electrode 109 via a part of the channel layer 104 is modulated.

Since the two-dimensional electron gas layer having a low impurity density is used as the channel, the JPHEMT has a characteristic feature which enables the mobility to be increased. However, since the pn junction is used, the built-in voltage is only about one volt, and if a positive voltage of more than one volt is applied, the forward current flows and the gate leakage current increases. Accordingly, there is a problem in that the voltage applied to the gate is limited.

MIS Gate Structure Type Device

A MIS gate structure type HEMT device (MISHEMT; Metal Insulator Semiconductor High Electron Mobility Transistor) is a high frequency and high power device, in which a group III nitride material such as AlGaN/GaN, or AlInN/GaN is used. This semiconductor device performs a current modulation using a Metal Insulator Semiconductor (MIS) inversion layer and a hetero-junction. A configuration example of this semiconductor device is illustrated in FIG. 25.

Figure 25:
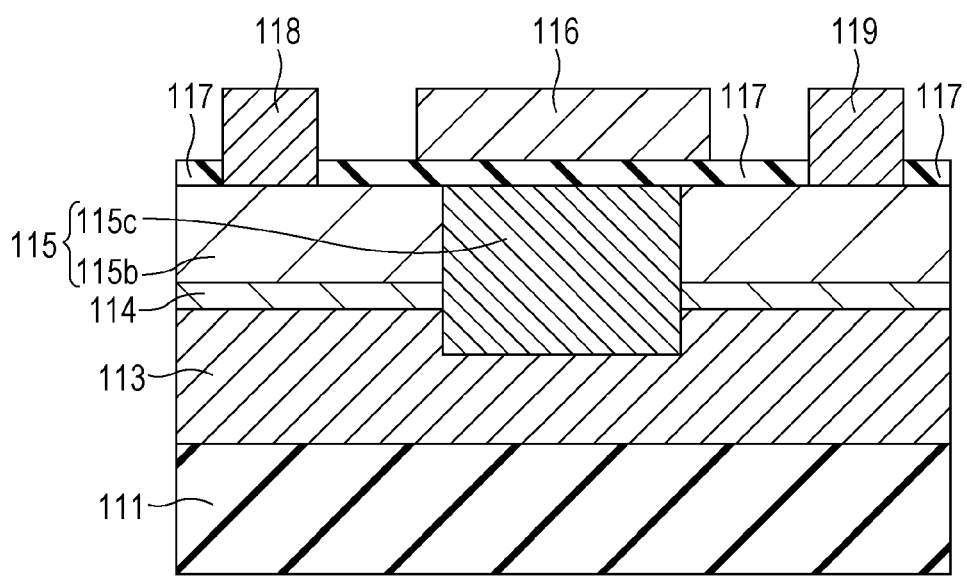
FIG. 25 is a diagram illustrating a configuration of a MIS gate structure type HEMT device.

In the semiconductor device illustrated in FIG. 25, a base layer 113 made of GaN, a barrier layer 115 made of AlGaN, and a gate insulating film 117 made of SiO are deposited in this order on a sapphire substrate 111. Then, on a part of a region of a gate insulating film 117, a gate electrode 116 is formed.

The barrier layer 115 is made of a high resistance layer 115b and a p-type low resistance region 115c. The p-type low resistance region 115c is formed directly under the gate insulating film 117 and, within the range substantially hidden by the gate electrode 116 in a case where the gate electrode 116 is viewed in plan from the surface side thereof.

When the voltage is applied to the gate electrode 116, an inversion layer is formed on the interface between the gate electrode 116 and the gate insulating film 117 in the p-type low resistance region 115c, and the current flowing between the source electrode 118 and the drain electrode 119 is modulated.

In addition, in the MIS gate structure-type HEMT device using the group III nitride material, since the gate insulating film 117 is formed between the gate electrode 116 and the p-type low resistance region 115c, the gate leakage current is low, and a high positive voltage can be applied to the gate electrode 116.

However, when the device is in an ON operation, since the inversion layer formed on the semiconductor surface by a MIS operation is acting as the channel, there is a problem in that the mobility becomes low compared to the case where the two-dimensional electron gas layer is acting as the channel.

Even in the logic device application using a group III-V material, with respect to the device in which the improvement of the performance using InGaAs with excellent electron transportation characteristics is investigated, the original performance of the mobility in the channel using the inversion layer may not be realized.

MISPHEMT and MISJPHEMT

With respect to the above described problem of an FET, for the FET that has both of the characteristics of retaining the high mobility, and decreasing the gate leakage current and being able to apply the high positive voltage to the gate electrode, a Metal Insulator Semiconductor Pseudomorphic High Electron Mobility Transistor (MISPHEMT) and a Metal Insulator Semiconductor Junction-gate Pseudomorphic High Electron Mobility Transistor (MISJPHEMT) are proposed.

In the MISJPHEMT, both of the high mobility and the low gate leakage current can be expected by inserting the gate insulating film such as $Al_2O_3$ in between the gate electrode and the semiconductor layer of the JPHEMT. Since the gate leakage current can be suppressed, the high positive voltage can be applied to the gate electrode, and thus it is possible to decrease the ON resistance Ron. Additionally, it is possible to increase the maximum drain current Idmax. This can contribute to decreasing the power consumption of the antenna switch and the power amplifier.

On the other hand, in the MISPHEMT and the MISJPHEMT, there exist two channels as the channels where the carriers travel; these are a two-dimensional electron gas layer of the PHEMT and the interface of the gate insulating film and the semiconductor of the MIS.

In an example of the MISPHEMT, according to the increase of the voltage applied to the gate, the current due to the transport of electrons accumulated in the interface of the insulating film and the semiconductor of the MIS is added to the current due to the electrons traveling in the two-dimensional electron gas layer of the PHEMT. Due to the structural constraints of the MISPHEMT, the carrier transportation characteristics of the semiconductor material used for the MIS section is inferior to that of the two-dimensional electron gas layer. For this reason, the drain current flowing between the source electrode and the drain electrode increases in an absolute value, and leads to a deterioration of the voltage dependence applied to the gate, of a transmission conductance. Since the distortion characteristics of the antenna switch and the power amplifier has a positive correlation with the transfer conductance characteristics, the deterioration of the applied voltage dependence of the transmission conductance leads to a deterioration of the distortion characteristics. Therefore, it is desirable to improve the dependence.

2. First Embodiment (Semiconductor Device)

MISJPHEMT: Structure

Figure 1:
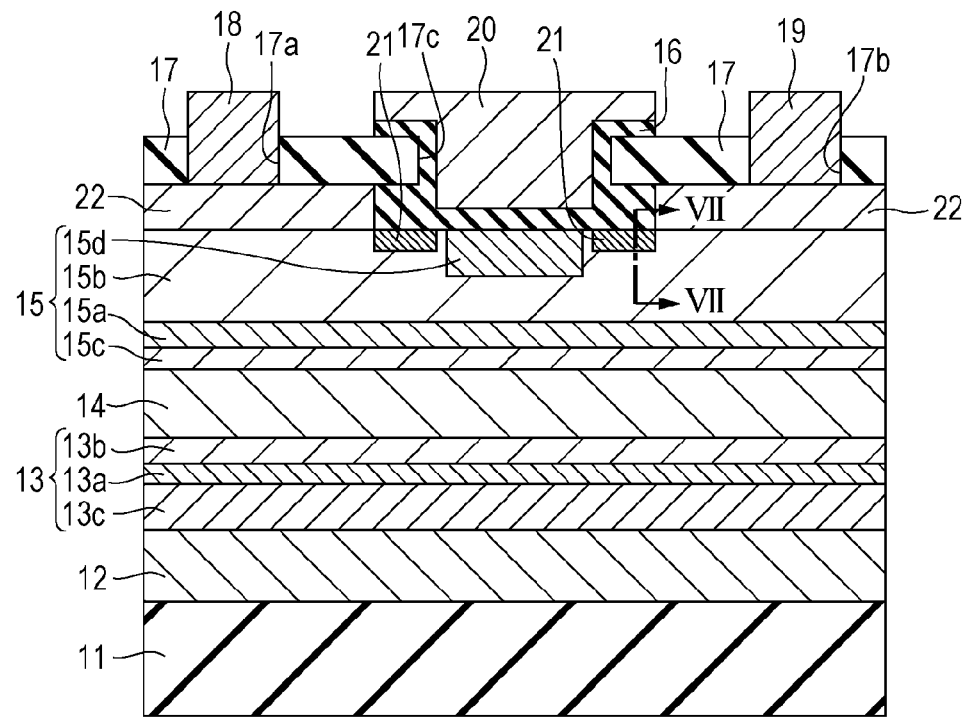
FIG. 1 is a diagram illustrating a schematic configuration of a semiconductor device according to a first embodiment.

Next, a first embodiment of the present disclosure will be described. A schematic configuration of a semiconductor device according to the first embodiment is illustrated in FIG. 1. The semiconductor device illustrated in FIG. 1 is a so-called MISJPHEMT that includes a barrier layer in between the gate electrode and the channel layer, and a conduction type of low resistance region which is different from a conduction type of barrier layer is further provided in the barrier layer, and in addition, the gate electrode is provided on the low resistance region via the insulating film.

In the semiconductor device illustrated in FIG. 1, a buffer layer 12, a lower barrier layer 13, a channel layer 14, an upper barrier layer 15, and a gap layer 22 that are made of each compound semiconductor material are deposited in this order on a substrate 11 made of a compound semiconductor.

In the lower barrier layer 13, a carrier supply layer 13a is provided. In the upper barrier layer 15, a p-type low resistance region 15d is provided together with the carrier supply layer 15a.

Then, on the deposited body of the semiconductor layer made of the compound semiconductor materials described above, an insulating layer 17 is provided. On the insulating layer 17, openings 17a and 17b are provided. In the openings 17a and 17b, a source electrode 18 and a drain electrode 19 are formed, which are connected to the upper barrier layer 15 via the gap layer 22.

In addition, in between the openings 17a and 17b, an opening 17c is provided in the insulating layer 17 and the gap layer 22. The opening 17c is formed in such a manner that the opening width of the gap layer 22 is larger than that of the insulating layer 17. In the opening 17c, a gate insulating film 16 is formed on the upper barrier layer 15 along the bottom surface and the side surface of the opening 17c.

A gate electrode 20 is formed on the upper part of the gate insulating film 16. A p-type low resistance region 15d is formed directly under the gate electrode 20 via the gate insulating film 16. Current block regions 21 are provided on the surface of the upper barrier layer 15 and beneath the gate insulating film 16 on both sides of the p-type low resistance region 15d.

Substrate 11

The substrate 11 is formed of a compound semiconductor material having a semi-insulating property. The substrate 11 is formed of, for example, a group III-V compound semiconductor material, and a single crystal GaAs substrate or InP substrate having the semi-insulating property is used.

Buffer Layer 12

The buffer layer 12 is, for example, formed of an epitaxially grown compound semiconductor layer on the substrate 11, and is formed to use a compound semiconductor that is favorably lattice-matched with respect to the substrate 11 and the lower barrier layer 13. For example, in a case where the substrate 11 is made of the single crystal GaAs substrate, as an example of the buffer layer 12, an epitaxial growth layer of a u-GaAs (u- indicates that the impurities are not doped; hereinafter the same indication) to which the impurities are not doped is used.

Lower Barrier Layer

The lower barrier layer 13 is formed of a group III-V compound semiconductor having a higher conduction band position than that of a group III-V compound semiconductor forming the channel layer 14. Examples of the group III-V compound semiconductor having a high conduction band position include an AlGaAs mixed crystal and the like. For example, the lower barrier layer 13 is formed of $Al_{0.2}Ga_{0.8}As$ mixed crystal in which the aluminum (Al) composition ratio to the group III element is 0.2.

This lower barrier layer 13 includes a carrier supply layer 13a in which n-type impurities that are second conduction type impurities are included in a high density, and high resistance layers 13b and 13c having high resistance. These high resistance layers 13b and 13c may include n-type impurities with a low density or p-type impurities that are first conduction type impurities, and may not include n-type impurities and p-type impurities. In the high resistance layers 13b and 13c, it is preferable that the impurity density is equal to or lower than $1\times10^{17}$ pcs./cm$^3$ and the specific resistance is equal to or higher than $1\times10^{-2}$ Ωcm.

The lower barrier layer 13, for example, includes the carrier supply layer 13a which is 4 nm in thickness and to which silicon is added in approximately $3\times10^{18}$ cm$^{-3}$ as n-type impurities. Then, the lower barrier layer 13 has a structure in which, on and beneath the carrier supply layer 13a, the high resistance layer 13c which is 200 nm in thickness and to which the impurities are not added, and the high resistance layer 13b which is 2 nm in thickness and to which the impurities are not added, are deposited on the substrate 11. Moreover, the lower barrier layer 13 may not include the high resistance layers 13b and 13c, and the entire region may be the carrier supply layer 13a.

Channel Layer

The channel layer 14 is a current flow path between the source electrode 18 and the drain electrode 19. The channel layer 14 is formed of a group III-V compound semiconductor having a lower conduction band position than the group III-V compound semiconductor forming the lower barrier layer 13 and the upper barrier layer 15 has. Examples of the group III-V compound semiconductor having a lower conduction band position include InGaAs mixed crystal and the like. The channel layer 14, for example, is formed of a u-$In_{0.2}Ga_{0.8}As$ mixed crystal in which the indium (In) composition ratio to the group III element is 0.2 and to which the impurities are not added. As a result, the channel layer 14 is formed in such a manner that the carriers are accumulated, which are supplied from the carrier supply layer 13a of the lower barrier layer 13 and the carrier supply layer 15a of the upper barrier layer 15 described below.

For example, in a case where the channel layer 14 is formed of the InGaAs mixed crystal, it is preferable that the indium composition ratio to the group III element is equal to or higher than 0.1. The higher the indium composition ratio is, the narrower the band gap can be. If the indium composition ratio is equal to or higher than 0.1, it is possible to make the difference of each conduction band position between the lower barrier layer 13 and the channel layer 14, and between the upper barrier layer 15 and the channel layer 14 respectively large enough. In addition, it is preferable that the thickness of the channel layer 14 is equal to or thinner than 15 nm. That is because the crystallinity of the channel layer 14 deteriorates when it becomes thicker.

Upper Barrier Layer

The upper barrier layer 15 includes the carrier supply layer 15a in which n-type impurities having a high density are included, and high resistance layers 15b and 15c having high resistance. In addition, in the high resistance layer 15c, p-type low resistance region 15d is included.

The upper barrier layer 15 is formed of the group III-V compound semiconductor having a higher conduction band position than the group III-V compound semiconductor forming the channel layer 14 has. For example, this upper barrier layer 15 is formed of the $Al_{0.2}Ga_{0.8}As$ mixed crystal in which the aluminum composition ratio to the group III element is 0.2.

In a case where the upper barrier layer 15 is formed of the AlGaAs mixed crystal, it is preferable that the aluminum composition ratio to the group III element be equal to or lower than 0.25. By making the aluminum composition ratio equal to or lower than 0.25, it is possible to suppress the increase of the so-called source resistance. In addition, at a time of forming the p-type low resistance region 15d by the diffusion of the p-type impurities that will be described below, it is possible to suppress the diffusion speed, and the controllability can be improved.

The upper barrier layer 15 includes the carrier supply layer 15a which has impurities that supplies the carriers. For example, the n-type carrier supply layer 15a that includes silicon (Si) as the n-type impurities which supplies electrons is arranged in the middle portion of the upper barrier layer 15 in a film thickness direction.

The high resistance layers 15b and 15c may include the n-type impurities or p-type impurities with a low density. In addition, the high resistance layers 15b and 15c may not include the n-type impurities and p-type impurities.

The p-type low resistance region 15d is a diffusion region of the p-type impurities with a high density. The p-type low resistance region 15d is the p-type low resistance region provided with respect to the gate electrode 20 in a region between the source electrode 18 and the drain electrode 19. This p-type low resistance region 15d is located between the gate insulating film 16 and the high resistance layer 15b, and is formed of, for example, zinc (Zn) which is a p-type impurity and which is diffused into a portion of the high resistance layer 15b. It is preferable that the density of the p-type impurities in the p-type low resistance region 15d be equal to or higher than $1\times10^{18}$ $cm^{-3}$.

For example, the upper barrier layer 15 includes the carrier supply layer 15a which is 4 nm in thickness and to which silicon is added in approximately $3\times10^{18}$ $cm^{-3}$ as the n-type impurities. Then, the upper barrier layer 15 has a structure in which, on and beneath the carrier supply layer 15a, the high resistance layer 15c which is 2 nm in thickness and to which the impurities are not added, and the high resistance layer 15b which is 30 nm in thickness and to which the impurities are not added, are deposited from the channel layer 14 side.

In addition, the upper barrier layer 15 has a structure in which the p-type low resistance region 15d having the p-type impurity density of approximately $1\times10^{19}$ $cm^{-3}$ is embedded in the high resistance layer 15b, while being in contact with the gate insulating film 16.

Moreover, in this example, an example in which the lower barrier layer 13 and the upper barrier layer 15 are formed of the same composition of the $Al_{0.2}Ga_{0.8}As$ mixed crystal is described. However, the lower barrier layer 13 and the upper barrier layer 15 may be formed of the AlGaAs mixed crystal having mutually different compositions.

In the upper barrier layer 15, it is preferable that the aluminum composition ratio to the group III element be equal to or lower than 0.25. On the contrary, in the lower barrier layer 13, it is not necessary that the p-type low resistance region be formed by the diffusion of the p-type impurities. For this reason, in the structure of the lower barrier layer 13, the aluminum composition ratio can be higher compared to the upper barrier layer 15.

In addition, it is preferable that the density of impurities in the high resistance layers 13b and 15b be equal to lower than $1\times10^{17}$ $cm^{-3}$ and preferable that the specific resistance be equal to or higher than $1\times10^{-2}$ $\Omega cm$.

Gap Layer

The gap layers 22 are provided between the upper barrier layer 15 and the source electrode 18, and between the upper barrier layer 15 and the drain electrode 19. The gap layer 22 is formed as a layer that includes conduction-type impurities which are different from those in the p-type low resistance region 15d and the barrier layer. In addition, the gap layer 22 is formed of the same material as that of the upper barrier layer 15, or formed of the semiconductor material having the conduction band position between the work function of the source electrode 18 and the drain electrode 19 and the conduction band position of the upper barrier layer 15.

The gap layer 22 has an object of reducing the access resistance to the channel. The access resistance is made of a contact resistance of the semiconductor and the electrodes and the resistance from the electrodes to the channel layer 14. For this reason, in order to reduce both resistances, the impurities with a high density are added to the gap layer 22.

Insulating Layer

The insulating layer 17 has an insulation property with respect to the compound semiconductor that forms the upper barrier layer 15, and a material is used which has a function of protecting a surface of a layer lower than the ion impurities and the like (here, the upper barrier layer 15). The insulating layer 17, for example, is formed of silicon nitride ($Si_3N_4$) having a thickness of 200 nm.

Source Electrode 18 and Drain Electrode 19

The source electrode 18 and the drain electrode 19 are respectively in ohmic contact with the upper barrier layer 15 in the position where crossing the p-type low resistance region 15d via the openings 17a and 17b. The source electrode 18 and the drain electrode 19 are formed of a material in which gold-germanium (AuGe), Nickel (Ni), and gold (Au) are deposited in sequence and alloyed in an order from the upper barrier layer 15 side. Each film thickness of the source electrode 18 and the drain electrode 19 is, for example, a total of approximately 1000 nm respectively.

Gate Insulating Film

The gate insulating film 16 is provided at the lower part of the opening 17c formed on the insulating layer 17, and is provided in a state to completely close the opening 17c. Then, the edge of the gate insulating film 16 is provided to the upper part of the insulating layer 17. The gate insulating film 16 is formed of oxide or nitride, and for example, formed of aluminum oxide ($Al_2O_3$) having a thickness of 10 nm.

Gate Electrode

The gate electrode 20 is provided above the upper part of the p-type low resistance region 15d via the gate insulating film 16. The gate electrode 20 is provided in a state of embedding the opening 17c. The gate electrode 20 is formed of titan (Ti), platinum (Pt), and gold deposited in sequence from the substrate 11 side.

Current Block Regions

In addition, as illustrated in FIG. 1, the current block regions 21 are formed on both sides of the p-type low resistance region 15d. In the semiconductor device with the configuration illustrated in FIG. 1, a Fermi level pinning occurs due to the interface state between the gate insulating film 16 and the high resistance layer 15b. That is, the depletion layer is generated in the high resistance layer 15b by the interface state between the gate insulating film 16 and the high resistance layer 15b of the upper barrier layer 15. In this way, the effect of the depletion layer expanding into the semiconductor in both sides of the gate electrode 20 is realized in a form of the current block regions 21.

Figure 2A:
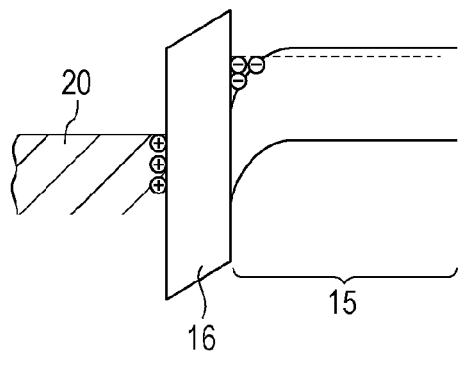
FIG. 2A is a diagram illustrating an energy band configuration in a case where an interface state density is low, in a gate insulating film and an upper barrier layer.
Figure 2B:
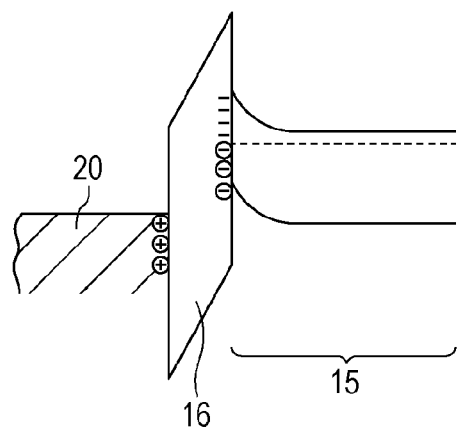
FIG. 2B is a diagram illustrating an energy band configuration in a case where an interface state density is high, in the gate insulating film and the upper barrier layer.

How the current block regions 21 are formed by the interface state will be described using an energy band configuration illustrated in FIG. 2A and FIG. 2B. FIG. 2A illustrates the energy band configuration in a case where the interface state density is low in the gate insulating film 16 and the upper barrier layer 15. In addition, FIG. 2B illustrates the energy band configuration in a case where the interface state density is high in the gate insulating film 16 and the upper barrier layer 15.

As illustrated in FIG. 2A, in a case where the interface state density is low, the electrons are accumulated in the upper barrier layer 15 side by applying the voltage to the gate electrode. For this reason, a current path is generated in the interface of the gate insulating film 16 and the upper barrier layer 15. On the contrary, in a case where the interface state density is high, it is difficult for electrons to be accumulated in the upper barrier layer 15 side by applying the voltage to the gate electrode. For this reason, a current path is not generated in the interface of the gate insulating film 16 and the upper barrier layer 15.

Generally, comparing the p-type low resistance region 15d and the high resistance layer 15b, the interface state with a high density is easily formed at the deep position in the band gap, in the high resistance layer 15b and the gate insulating film 16. For this reason, the depletion layer which contributes as the current block regions in the high resistance layer 15b is easily extended from the interface of the gate insulating film 16 and the high resistance layer 15b.

In addition, since the gate electrode 20 is not in contact with this region, it is less susceptible to being affected by the voltage applied to the gate. Therefore, even though the positive voltage is applied, the width of the depletion layer is not easily changed, and thus, the effect of the current block region is expected in the wide range of the voltage applied to the gate.

MISJPHEMT: Operation

The Energy Band

Figure 3:
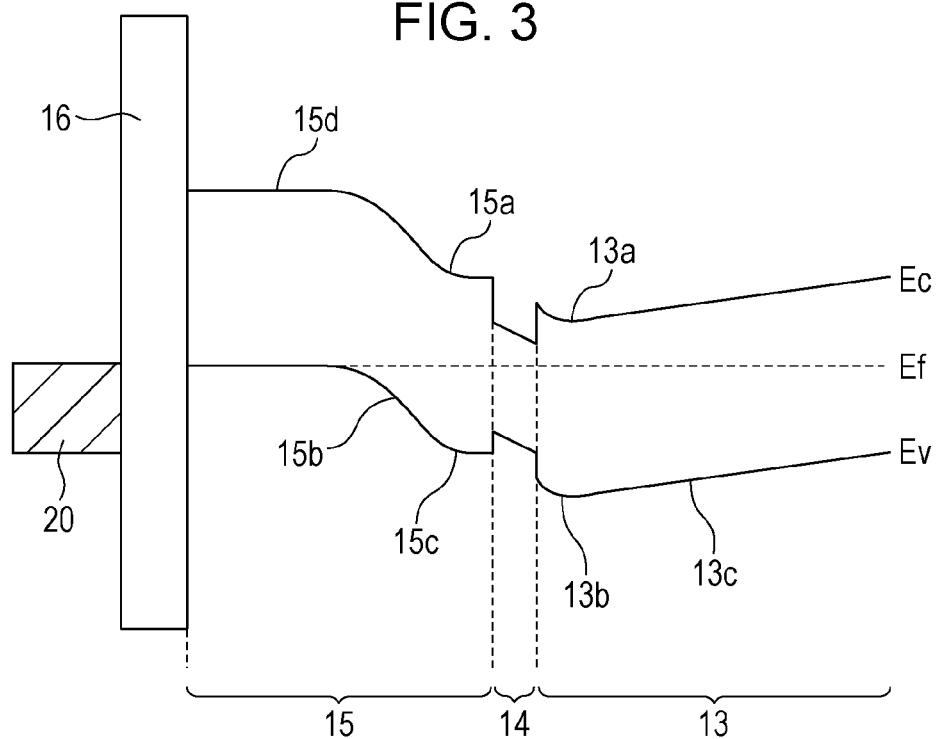
FIG. 3 is a diagram illustrating an energy band configuration in a state in which a gate voltage of approximately zero volt is applied to a gate electrode.
Figure 4:
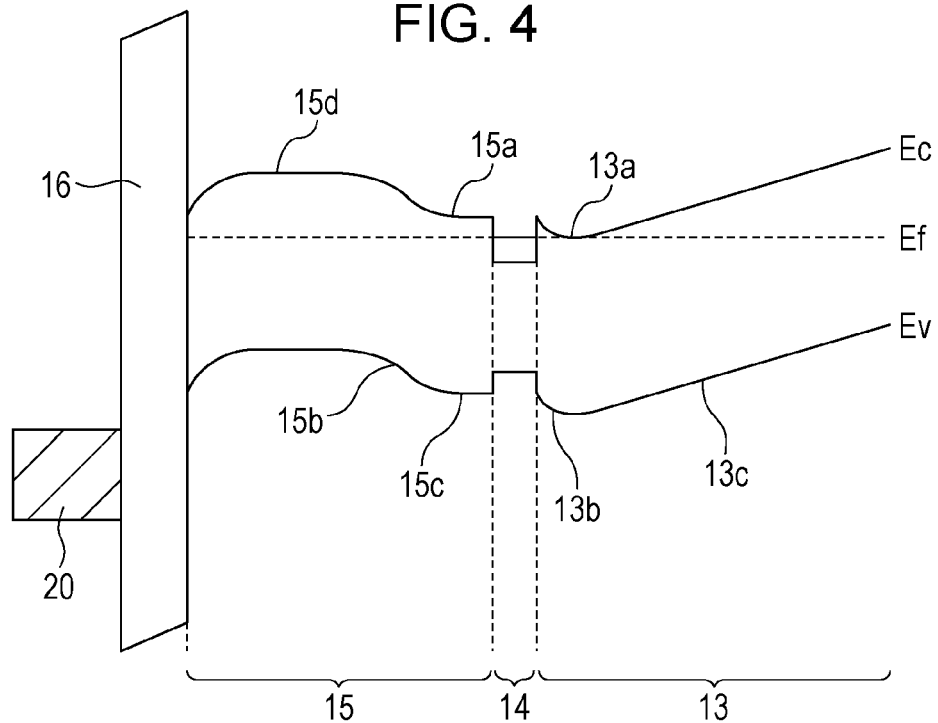
FIG. 4 is a diagram illustrating an energy band configuration in a state in which a gate voltage of approximately three volts is applied to a gate electrode.

In FIG. 3 and FIG. 4, the configuration of the energy band under the gate electrode 20 of the semiconductor device configured as described above is illustrated. FIG. 3 illustrates a state where approximately zero volt of a gate voltage Vg is applied. FIG. 4 illustrates a state where approximately three volts of a gate voltage Vg is applied. Moreover, in FIG. 3 and FIG. 4, the semiconductor device is illustrated, in which the lower barrier layer 13 and the upper barrier layer 15 are formed of the $Al_{0.2}Ga_{0.8}As$ mixed crystal respectively, and the channel layer 14 is formed of the $In_{0.2}Ga_{0.8}As$ mixed crystal.

As illustrated in FIG. 3, the semiconductor device described above is configured in such a manner that a discontinuity amount $\Delta Ec$ of the conduction band edge of the channel layer 14 and the upper barrier layer 15 is sufficiently large (here, 0.31 eV). In addition, the semiconductor device is configured in such a manner that the difference between the potential minimum point of the upper barrier layer 15 and the Fermi level of the electrons in the channel layer 14 is sufficiently large (here, 0.20 eV or higher). For this reason, the number of the electrons distributed in the upper barrier layer 15 is small enough to be ignored compared to the number of the electrons distributed in the channel layer 14.

In addition, the semiconductor device described above has a configuration in which the channel layer 14 is interposed between the lower barrier layer 13 of which the conduction band position is higher than that of the channel layer 14, and the upper barrier layer 15. For this reason, when the carriers are supplied from the carrier supply layers 13a and 15a of the lower barrier layer 13 and the upper barrier layer 15, the channel layer 14 accumulates the carriers and becomes the two-dimensional electron gas layer.

In this semiconductor device, the gate insulating film being provided between the gate electrode and the first conduction-type p-type low resistance region, there is no such a case of a large forward current flowing as in the case of the pn junction. For this reason, the gate leakage current can greatly be reduced, and it is possible to apply a large positive voltage to the gate electrode 20.

In addition, as illustrated in FIG. 1, the semiconductor device has the current block regions 21 on both sides of the p-type low resistance region 15d. In this way, by applying the positive voltage to the gate electrode 20, even in a case where MIS structure made of the gate electrode 20, the gate insulating film 16, and the p-type low resistance region 15d performs an inversion operation and the carriers are generated in the interface between the gate insulating film 16 and the p-type low resistance region 15d, those carriers do not contribute to the current flowing between the source electrode 18 and the drain electrode 19.

Operation

In the semiconductor device configured as described above, in the state where approximately zero volt of the gate voltage Vg is applied to the gate electrode 20, a valance band position Ev in the p-type low resistance region 15d beneath the gate insulating film 16 is constant, and substantially matches with the Fermi level Ef.

Figure 5:
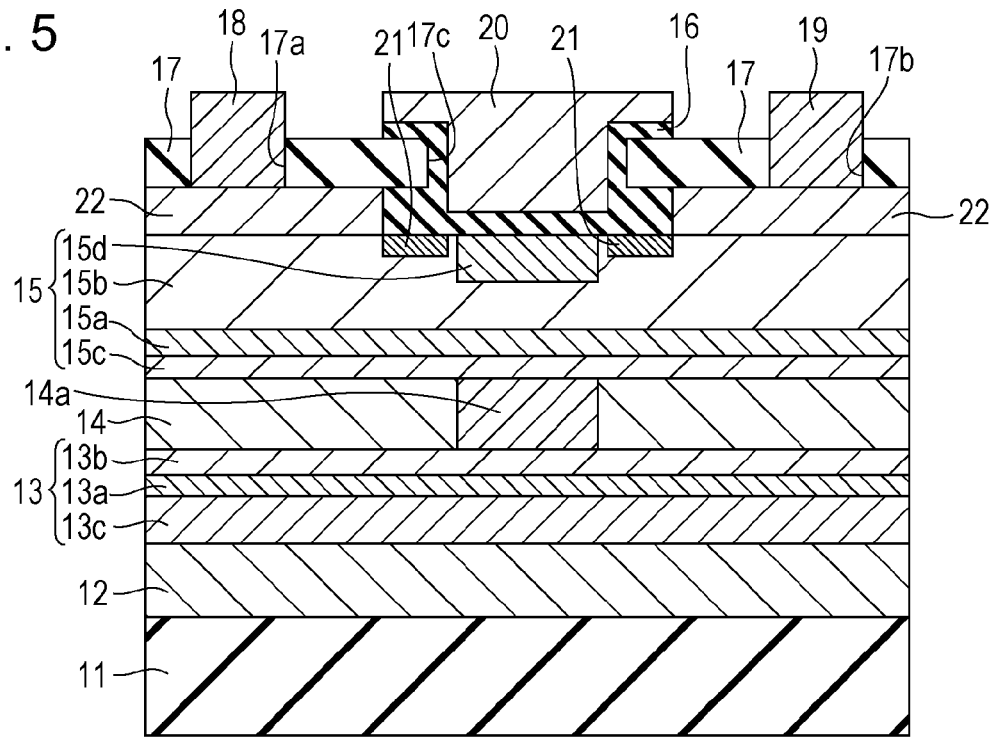
FIG. 5 is a diagram illustrating a schematic configuration of a semiconductor device in which a carrier deficiency region is formed.

In addition, in a case where the gate voltage Vg is lower than the threshold voltage, as illustrated in FIG. 5, a carrier deficiency region 14a where the electrons are depleted is formed in the region within channel layer 14 positioned directly under the p-type low resistance region 15d in the semiconductor device. The energy band configuration at this time is illustrated in FIG. 3. In this way, the channel layer 14 is in a high resistance state due to the carrier deficiency region 14a. Therefore, between the source electrode 18 and the drain electrode 19, the drain current Id does not flow via the channel layer 14, and the semiconductor device becomes in an OFF state.

On the other hand, in the state where approximately three volts of the positive gate voltage Vg is applied to the gate electrode 20 of the semiconductor device, the conduction band position Ec of the p-type low resistance region 15d via the gate insulating film 16 is lowered. For this reason, the holes in the p-type low resistance region 15d are depleted. The energy band configuration at this time is illustrated in FIG. 4.

In addition, at this time, the carrier deficiency region 14a in the channel layer 14 illustrated in FIG. 5 disappears. For this reason, the number of electrons in the channel layer 14 increases, and the drain current Id between the source electrode 18 and the drain electrode 19 flows via the channel layer 14. This drain current Id is modulated by the gate voltage Vg.

In the JPHEMT in the related arts, the voltage applied to the gate electrode is equal to or lower than 1.0 V. However, the voltage applied to the gate electrode in this semiconductor device is not necessarily being equal to or lower than 1.0 V. That is, comparing to the JPHEMT, in the exemplified semiconductor device, it is possible to apply a high positive voltage to the gate electrode 20. For this reason, the ON resistance Ron of the channel layer 14 is decreased and the maximum drain current Idmax is increased. Furthermore, the size of the device can be decreased and a parasitic capacitance can be decreased.

Current Block Regions

Incidentally, in the semiconductor device with the above-described configuration, in a case of a configuration in which the current block regions are not included, when the positive gate voltage Vg of equal to or higher than 3.0 V is applied to the gate electrode 20, the below-described phenomenon occurs.

Figure 6:
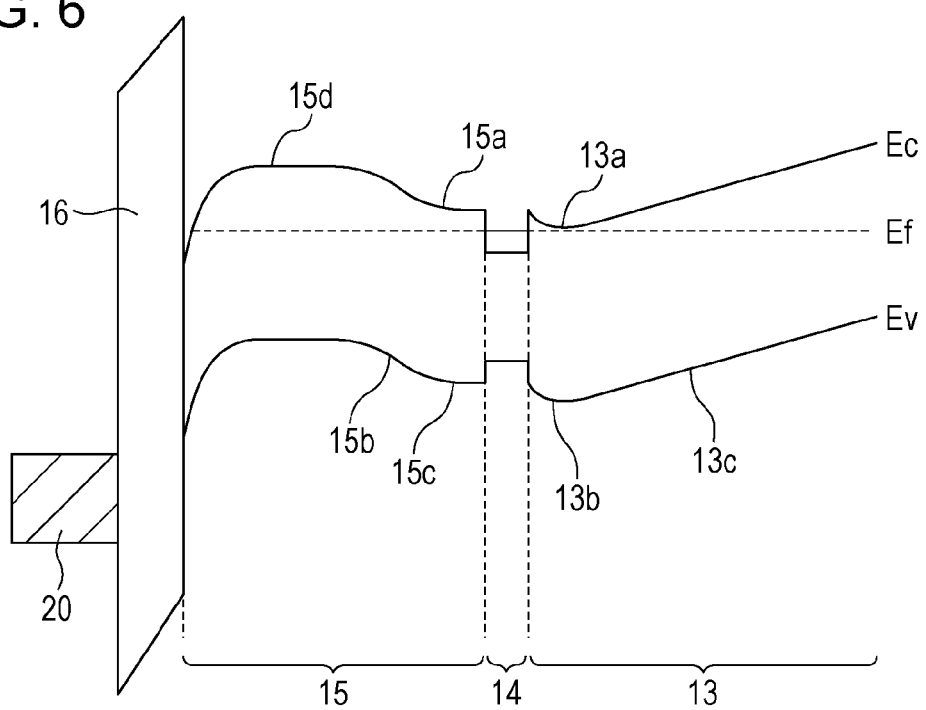
FIG. 6 is a diagram illustrating an energy band configuration in a state in which a gate voltage of three or more volts is applied to a gate electrode.

When the positive gate voltage Vg is applied to the gate electrode 20, the conduction band position of the p-type low resistance region 15d via the gate insulating film 16 is lowered, and the inversion operation starts to occur in the region of the gate insulating film 16 and the p-type low resistance region 15d. For this reason, the number of electrons existing in the interface between the insulating film and the semiconductor increases, and a path through which the drain current Id flows other than in the channel layer 14 is formed. At that time, because the drain current Id is a sum of the currents flowing through the reverse operation portion and the channel layer 14, the total value of the drain current becomes large. The energy band configuration at this time is illustrated in FIG. 6.

Figure 7:
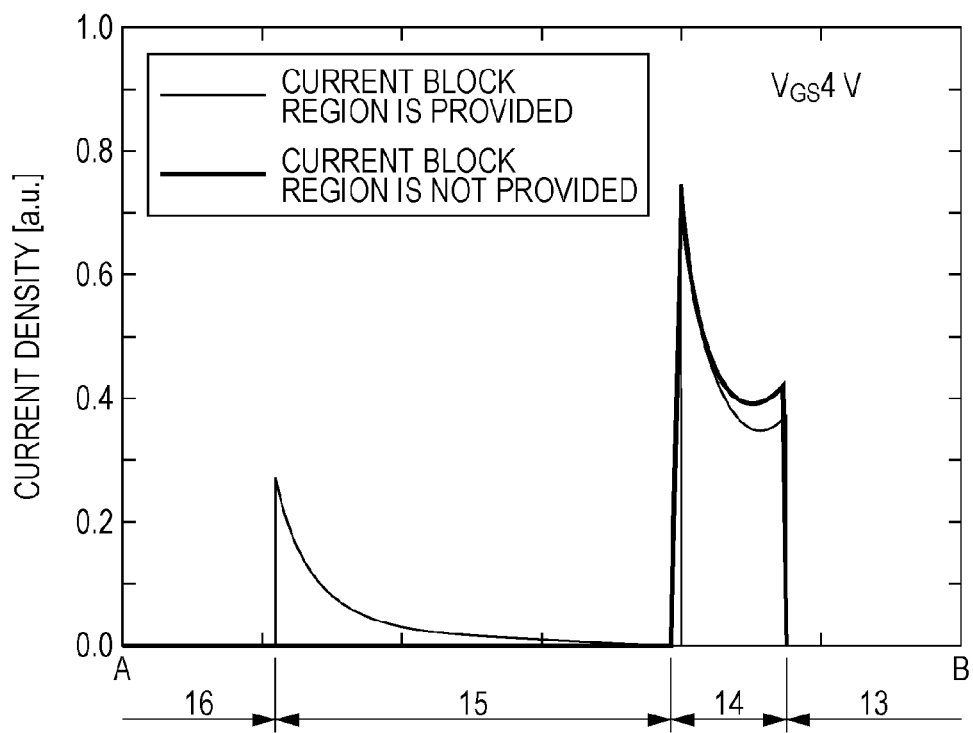
FIG. 7 is a diagram illustrating a two-dimensional distribution of carriers when a voltage is applied to a gate and a current density beside the gate electrode.

In FIG. 7, the current density distribution beside the gate electrode when the gate voltage is applied is illustrated. Since the difference of the current is evaluated by the presence or absence of the current block regions, the current density in VII-VII line cross-sectional diagram in FIG. 1 is illustrated in FIG. 7. Here, the case of the current block regions being present is a case of the semiconductor device configured as illustrated in FIG. 1 described above. In addition, the case of the current block regions not being present is a case of the semiconductor device configured as illustrated in FIG. 1 described above from which the current block regions 21 are removed.

As illustrated in FIG. 7, in the semiconductor device which does not have the current block regions, the current is generated in the channel layer 14, and in the interface between the gate insulating film 16 and the high resistance layer 15b (interface between the gate insulating film and the semiconductor).

On the contrary, in the semiconductor device having the current block regions, the current is generated only in the channel layer 14, and is not generated in the interface between the gate insulating film 16 and the high resistance layer 15b. In this way, it is understood that the current flowing in the interface between the insulating film and the semiconductor at the time of the inversion operation can be suppressed by the current block regions 21.

The mobility of the electrons traveling in the inversion layer formed in the interface between the insulating layer and the semiconductor and the mobility of the electrons traveling in the channel layer 14 are not the same. The mobility of the electrons traveling in the semiconductor material used in the upper barrier layer 15 represented by the AlGaAs layer is 1000 to 3000 cm$^2$/V-sec, and is lower than that in the channel layer 14. Therefore, the transfer conductance (gm; amount of change of the drain current with respect to the change of the voltage applied to the gate electrode) which is one of the operation capabilities of the transistor shows a large dependence on the voltage applied to the gate electrode because the places where the electrons are traveling are increased from one to two. This state is illustrated in FIG. 8.

Figure 8:
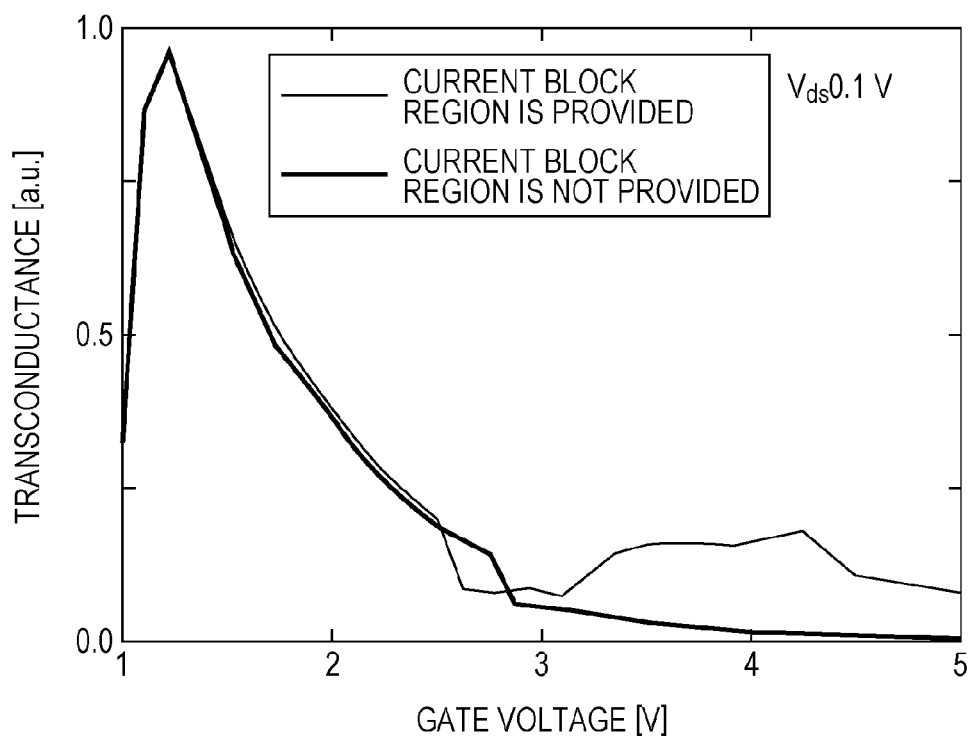
FIG. 8 is a diagram illustrating a relationship between the amount of change of a transfer conductance and a change of a voltage applied to the gate electrode.

As illustrated in FIG. 8, in the semiconductor device which does not have the current block regions, when the applied voltage is equal to or higher than 3 volts, the increase of the transfer conductance can be seen. In contrast, in the semiconductor device having the current block regions 21, even in a case where the applied voltage is equal to or higher than 3 volts, the transfer conductance does not increase. In this way, by including the current block regions 21, it can be understood that the gate voltage dependence of the transfer conductance gm is small. For example, in a case where the application to the antenna switching is assumed, the gate voltage dependence of the transfer conductance gm affects the distortion characteristics of the switch. Therefore, in the MISJPHEMT having the current block regions 21, the deterioration in the distortion characteristics is small.

ADVANTAGES

According to the semiconductor device in the embodiment of the present disclosure, since the gate insulating film 16 is formed between the gate electrode 20 and the p-type low resistance region 15d (interface between the gate insulating film and the semiconductor), the gate leakage current hardly flows in this interface. For this reason, a high positive voltage can be applied to the gate electrode 20, and the ON resistance Ron can be decreased. In addition, it is possible to increase the maximum drain current Idmax.

Furthermore, the semiconductor device has the current block regions, and since the gate voltage dependence of the transfer conductance is low even though the voltage applied to the gate is increased, the deterioration of the harmonic distortion characteristics at the time of ON can be suppressed compared to a structure in which the semiconductor device does not have the current block regions.

Therefore, if a wireless communication apparatus is configured using this semiconductor device, the size of the wireless communication apparatus can be decreased and the power consumption can be decreased. That is, in particular, in the mobile communication terminal, the size of the apparatus can be minimized and the operation time can be extended, and further it is possible to make it more easily portable.

Additionally, since the gate insulating film 16 is formed between the gate electrode 20 and the p-type low resistance region 15d, it is possible to improve the withstand voltage between the gate electrode 20 and the drain electrode 19.

3. First Embodiment (Method of Manufacturing the Semiconductor Device)

Next, a method of manufacturing the semiconductor device in the first embodiment described above will be described.

Figure 9A:
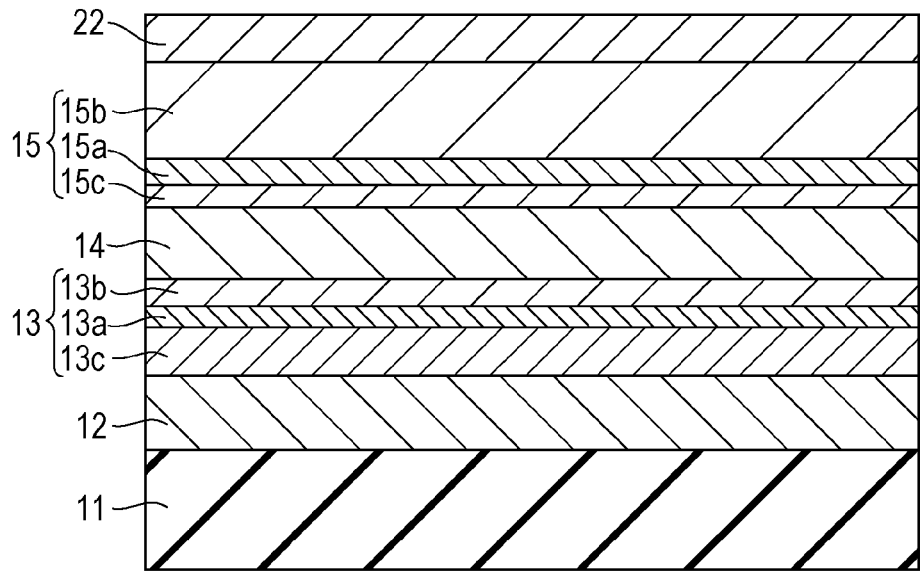
FIGS. 9A and 9B are process drawings of manufacturing the semiconductor device according to the first embodiment.

First, as illustrated in FIG. 9A, semiconductor layers are deposited on the substrate 11.

For example, on the substrate 11 made of GaAs, the buffer layer 12 is formed by epitaxially growing the u-GaAS layer, for example, to which the impurities are not added. Then, on the buffer layer 12, for example, the lower barrier layer 13 is formed by epitaxially growing the AlGaAs (Al$_{0.2}$Ga$_{0.8}$As mixed crystal) layer. At this time, the high resistance layer 13c made of a u-AlGaAs layer to which the impurities are not added, the carrier supply layer 13a made of an n-type AlGaAs layer to which silicon (Si) is added, and the high resistance layer 13b made of the u-AlGaAs layer to which the impurities are not added are epitaxially grown in sequence. In this way, the lower barrier layer 13 is formed, which includes the n-type carrier supply layer 13a in the center in the film thickness direction.

Next, on the lower barrier layer 13, the channel layer 14 is formed by epitaxially growing the u-InGaAs layer to which the impurities are not added.

Then, on the channel layer 14, the upper barrier layer 15 is formed by epitaxially growing the AlGaAs (Al$_{0.2}$Ga$_{0.8}$As mixed crystal) layer. At this time, the high resistance layer 15c made of the u-AlGaAs layer to which the impurities are not added, the carrier supply layer 15a made of the n-type AlGaAs layer to which silicon (Si) is added, and the high resistance layer 15b made of the u-AlGaAs layer to which the impurities are not added are epitaxially grown in sequence. In this way, the upper barrier layer 15 is obtained, which includes the n-type carrier supply layer 15a in the center in the film thickness direction.

Furthermore, on the upper barrier layer 15, for example, the n-type GaAs layer to which silicon is added as the n-type impurities is formed to be the gap layer 22.

Then, an inter-element separation is performed by a mesa etching or an isolation implantation (not illustrated).

Figure 9B:
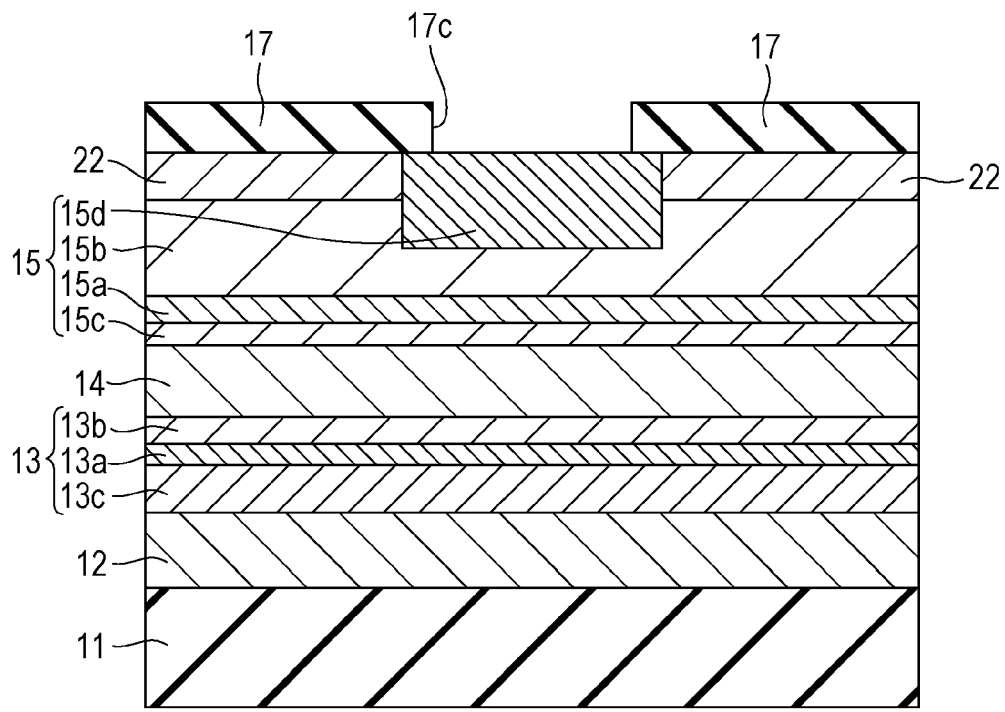

Next, as illustrated in FIG. 9B, on the gap layer 22, the insulating layer 17 is formed by forming a silicon nitride film using, for example, a plasma enhanced chemical vapor deposition (PECVD) method. Then, by performing a pattern etching on the insulating layer 17, the opening 17c that exposes the surface of the upper barrier layer 15 is formed on the gate electrode forming region. In this state, the p-type low resistance region 15d is formed in the upper barrier layer 15 by introducing the p-type impurities from the surface of the gap layer 22 exposed on the bottom part of the opening 17. For example, the p-type low resistance region 15d is formed by diffusing zinc which is the p-type impurities into the gap layer 22 and the high resistance layer 15b, at the temperature of approximately 600° C. Here, the p-type low resistance region 15d is formed by diffusing zinc (Zn) which is the p-type impurities into the position that does not reach the carrier supply layer 15a, that is, only on the surface layer in the high resistance layer 15b. The diffusion of zinc (Zn) is performed, for example, by a vapor-phase diffusion using zinc compound gas at the temperature of approximately 600° C. In this way, the p-type low resistance region 15d is formed by a self-alignment on the bottom part of the opening 17c.

Next, after the p-type low resistance region 15d is formed, only a part of the gap layer 22 exposed by the opening 17c is selectively removed using a citric acid-based etching solution, for example. Then, the gate insulating film 16 is formed by depositing an aluminum oxide film using an atomic layer deposition (ALD) method, on the high resistance layer 15b of the upper barrier layer 15 in which the insulating layer 17 is removed, and on the insulating layer 17.

After the forming of the gate insulating film 16, the gate electrode 20 is formed by sequentially depositing nickel and gold on the gate insulating film 16 and forming a pattern.

Next, the gate insulating film 16 and the insulating layer 17 are selectively removed by etching, and then the opening 17a and the opening 17b are respectively formed in the source electrode forming region and the drain electrode forming region between which the p-type low resistance region 15d is interposed. Then, for example, AuGe, nickel, and gold are sequentially deposited on the opening 17a and the opening 17b, and the pattern is formed. Subsequently, by the heat treatment at approximately 400° C., the source electrode 18 and the drain electrode 19 are respectively formed by forming gold alloy, and the semiconductor device illustrated in FIG. 1 can be formed.

In the gap beside the gate electrode, by the interface state between the gate insulating film 16 and the high resistance layer 15b of the upper barrier layer 15, the depletion layer is extended to the high resistance layer 15b and contributes as the current block regions 21. Generally, comparing the p-type low resistance region 15d with the high resistance layer 15b, at the position deep in the band gap in the latter and the gate insulating film 16, the interface state with a high density is easily formed. For this reason, the depletion layer which contributes as the current block regions 21 is easily extended. In addition, the gate electrode 20 is not in contact with this region, it is less susceptible to being influenced by the voltage applied to the gate. Therefore, even the positive voltage is applied, the depletion layer is not easily changed, and the effect of the current block region is expected in the wide range of the gate voltage.

The semiconductor device is preferably used for the wireless communication apparatus in the wireless communication system, for example. As the wireless communication apparatus, the apparatus of which the communication frequency is ultra high frequency (UHF) band or higher is preferable.

According to the semiconductor device in the embodiment, since the gate insulating film 16 is formed between the gate electrode 20 and the p-type low resistance region 15d, the gate leakage current hardly flows in the interface between the gate insulating film 16 and the high resistance layer 15b. For this reason, the large positive voltage can be applied to the gate electrode 20, and the ON resistance Ron can be decreased. In addition, it is possible to increase the maximum drain current Idmax.

If the wireless communication apparatus is configured using this semiconductor device, the size of the wireless communication apparatus can be decreased and the power consumption can be decreased. That is, in particular, in the mobile communication terminal, the size of the apparatus can be minimized and the operation time can be extended, and further it is possible to make it more easily portable.

Additionally, since the gate insulating film 16 is formed between the gate electrode 20 and the p-type low resistance region 15d, it is possible to improve the withstand voltage between the gate electrode 20 and the drain electrode 19.

Furthermore, according to the method of manufacturing the semiconductor device in the embodiment, the high resistance layer 15b made of the semiconductor having a wider band gap than that of the semiconductor that forms the channel layer 14 is formed between the channel layer 14 and the gate insulating film 16. Then, on the high resistance layer 15b, the p-type low resistance region 15d is formed by diffusing the p-type impurities corresponding to the gate electrode 20. Therefore, it is possible to easily manufacture the semiconductor device in the embodiment.

4. Second Embodiment (Semiconductor Device)

Next, a second embodiment of the semiconductor device will be described. The second embodiment is similar to the first embodiment described above. The semiconductor device in the second embodiment is the so-called the MISJPHEMT in which the barrier layer is provided between the gate electrode and the channel layer, and the conduction type low resistance region that is different from the barrier layer is provided in the barrier layer. In addition, in the second embodiment, the same configuration as the above described first embodiment will be referenced by the same numerals, and the detailed description will not be repeated.

Figure 10:
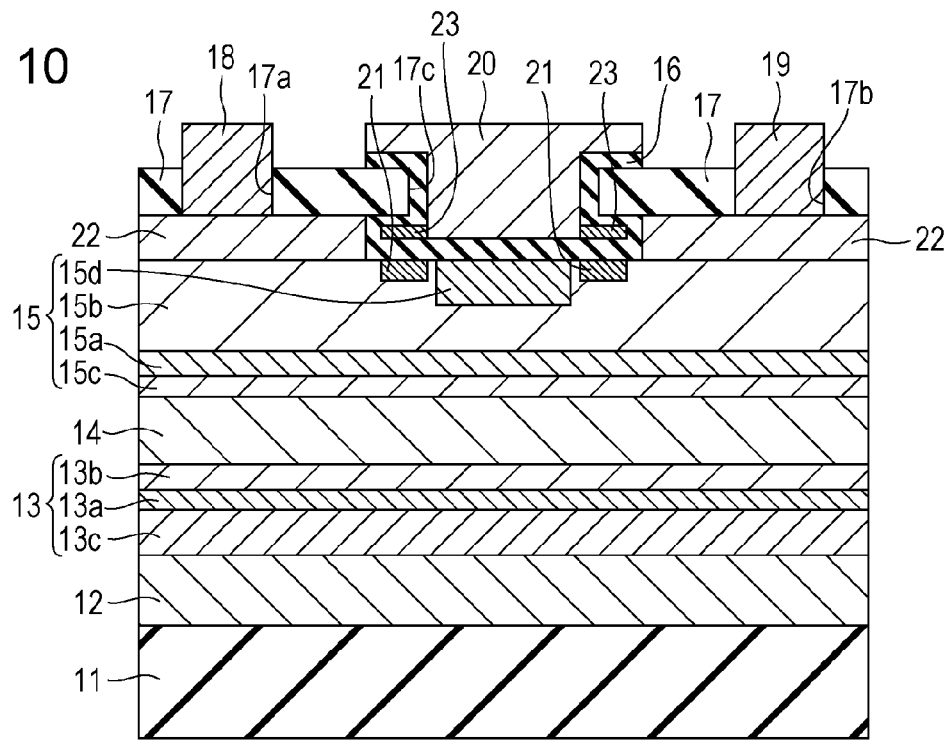
FIG. 10 is a diagram illustrating a schematic configuration of a semiconductor device according to a second embodiment.

The configuration of the semiconductor device in the second embodiment is illustrated in FIG. 10. As illustrated in FIG. 10, in the semiconductor device, the buffer layer 12, the lower barrier layer 13, the channel layer 14, the upper barrier layer 15, and the gap layer 22 that are made of each compound semiconductor material, are deposited in this order on the substrate 11.

In the lower barrier layer 13, a carrier supply layer 13a is provided. In the upper barrier layer 15, the p-type low resistance region 15d is provided together with the carrier supply layer 15a.

In addition, on the deposited body of each layer made of the compound semiconductor material described above, the insulating layer 17 is provided. On the insulating layer 17, openings 17a and 17b are provided. In the openings 17a and 17b, the source electrode 18 and the drain electrode 19 are formed, to be connected to the upper barrier layer 15 via the gap layer 22.

Between the openings 17a and 17b, an opening 17c is provided in the insulating layer 17 and the gap layer 22. The opening 17c is continuously formed in the insulating layer 17 and the gap layer 22 beneath the insulating layer 17, and is formed in such a manner that the opening width of the gap layer 22 is larger than that of the insulating layer 17.

The above-described configuration is similar to the configuration in the first embodiment described above.

In the opening 17c, the gate insulating film 16 is formed on the upper barrier layer 15 along the bottom surface and the side surface of the opening 17c. In the opening 17c, the gate insulating film 16 on the side wall of the gap layer 22 and on the upper barrier layer 15 is formed to have a thickness thinner than half of the thickness of the gap layer 22. For this reason, the gap 23 surrounded by the gate insulating film 16 and the side surface of the gate electrode 20 is provided on the same layer as the gap layer 22.

The gate electrode 20 is provided on the upper part of the gate insulating film 16 except the gap 23. The p-type low resistance region 15d is formed directly under the gate electrode 20 via the gate insulating film 16. The current block regions 21 are formed on the surface of the upper barrier layer 15 and beneath the gate insulating film 16 on both sides of the p-type low resistance region 15d.

The gap 23 is formed between the gate insulating film 16 provided on the side wall of the gap layer 22 and the gate electrode 20, and above the current block regions 21. In the opening 17c, since the opening width of the gap layer 22 is wider than that of the insulating layer 17, the gap 23 is provided in the position where two opening widths do not match.

For this reason, the configuration is shown in which the gap 23 is provided on the side surface of the gate electrode 20. Since the gap 23 is provided between the gate electrode 20 and the current block regions 21, it is possible to further suppress the influence of the voltage applied to the gate electrode on the current block regions via the gate insulating film, compared to the case in the first embodiment.

5. Third Embodiment (Semiconductor Device)

Next, a third embodiment of the semiconductor device will be described. The third embodiment is similar to the first embodiment described above. The semiconductor device in the third embodiment is the so-called MISJPHEMT in which the barrier layer is provided between the gate electrode and the channel layer, and the conduction type low resistance region that is different from the barrier layer is provided in the barrier layer. In addition, in the third embodiment, the same configuration as the above described first embodiment will be referenced by the same numerals, and the detailed description will not be repeated.

Figure 11:
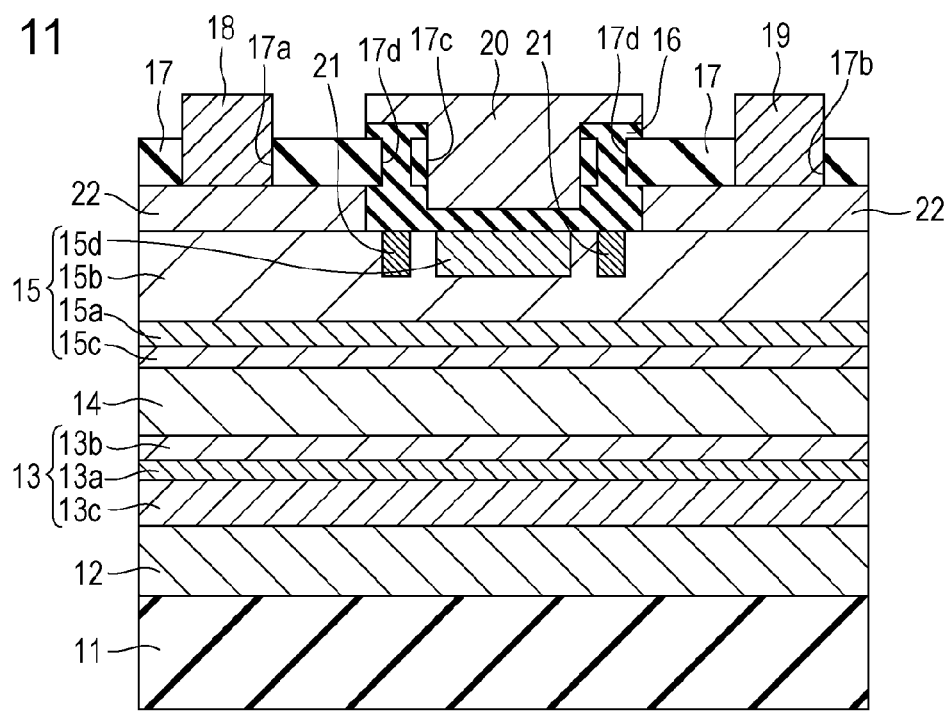
FIG. 11 is a diagram illustrating a schematic configuration of a semiconductor device according to a third embodiment.

The configuration of the semiconductor device in the third embodiment is illustrated in FIG. 11. As illustrated in FIG. 11, in the semiconductor device, the buffer layer 12, the lower barrier layer 13, the channel layer 14, the upper barrier layer 15, and the gap layer 22 that are made of each compound semiconductor material, are deposited in this order on the substrate 11.

In the lower barrier layer 13, a carrier supply layer 13a is provided. In the upper barrier layer 15, a p-type low resistance region 15d is provided together with the carrier supply layer 15a.

On the deposited body of each layer made of the compound semiconductor material described above, the insulating layer 17 is provided. On the insulating layer 17, openings 17a and 17b are provided. In the openings 17a and 17b, the source electrode 18 and the drain electrode 19 are formed, to be connected to the upper barrier layer 15 via the gap layer 22.

The above-described configuration is similar to the configuration in the first embodiment described above.

In addition, between the openings 17a and 17b, the openings 17c and 17d are provided on the insulating layer 17 and the gap layer 22. The opening 17c is provided on the position where the gate electrode 20 is formed, on the insulating layer 17 and the gap layer 22. The opening 17d is provided on both sides of the opening 17c, at a predetermined distance. At the bottom part of the insulating layer 17, the opening of the gap layer 22 is provided in such a manner that the opening 17c and the opening 17d are connected to the same layer as the gap layer 22. Then, the gate insulating film 16 is continuously formed in the opening of the gap layer 22 from the opening 17d to the upper barrier layer 15. In addition, the gate electrode 20 is formed on the upper part of the gate insulating film 16 from the opening 17c. The p-type low resistance region 15d is formed directly under the gate electrode 20 via the gate insulating film 16.

Furthermore, in the high resistance layer 15b, the current block regions 21 are provided beneath the gate insulating film 16 below the opening 17d.

The current block regions 21 are formed by introducing the impurities from the opening 17d to the high resistance layer 15b, at the time of forming the p-type low resistance region 15d or at the later process. For example, the opening 17d are provided on the openings 17c and both sides of the opening 17c by opening the insulating layer 17. Then, by introducing the impurities from the openings 17c and 17d, the p-type low resistance region 15d is formed under the opening 17c and the current block regions 21 are formed under the openings 17d. This region is made of the pn junction, and the depletion layer is extended to the high resistance layer 15b side and contributes as the current block region 21. Since the gate electrode 20 is not directly above the current block regions 21, and the voltage is applied thereto via the thick insulating film, the change of the depletion layer in the current block region 21 is small at the time when the gate voltage is applied. For this reason, even in a case where there are electrons between the p-type low resistance region 15d and gate insulating film 16 due to the inversion operation, the depletion layer can contribute as the current block region.

6. Fourth Embodiment (Semiconductor Device)

Next, a fourth embodiment of the semiconductor device will be described. The fourth embodiment is similar to the first embodiment described above. The semiconductor device in the fourth embodiment is the so-called MISJPHEMT in which the barrier layer is provided between the gate electrode and the channel layer, and the conduction type low resistance region that is different from the barrier layer is provided in the barrier layer. In addition, in the fourth embodiment, the same configuration as the above described first embodiment will be referenced by the same numerals, and the detailed description will not be repeated.

Figure 12:
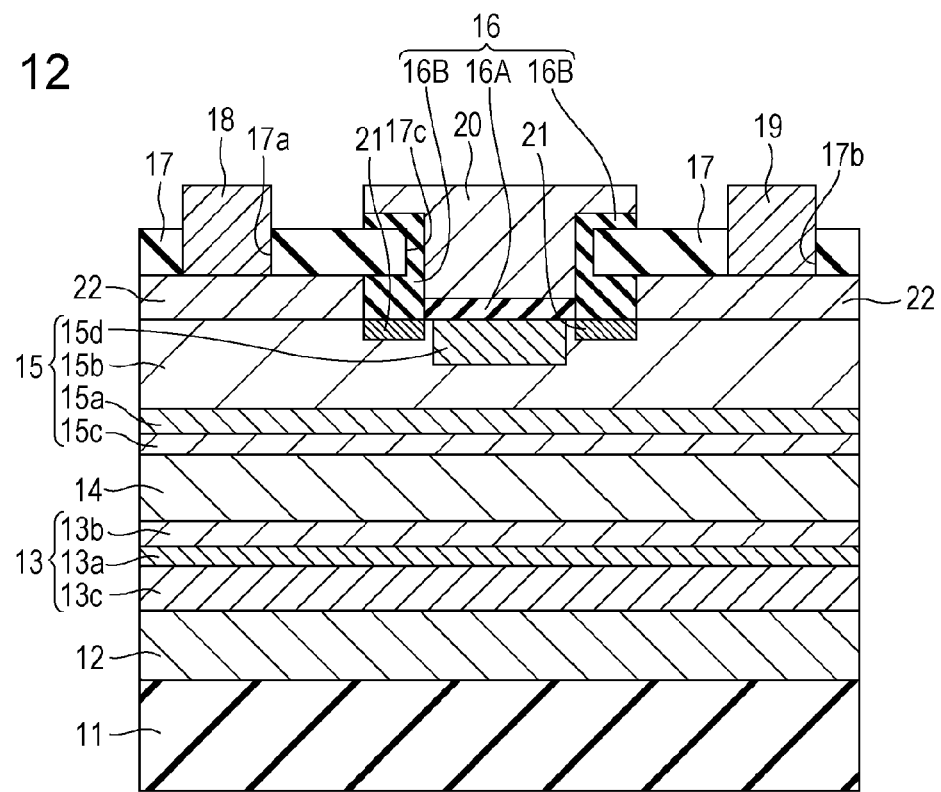
FIG. 12 is a diagram illustrating a schematic configuration of a semiconductor device according to a fourth embodiment.

The configuration of the semiconductor device in the fourth embodiment is illustrated in FIG. 12. As illustrated in FIG. 12, in the semiconductor device, the buffer layer 12, the lower barrier layer 13, the channel layer 14, the upper barrier layer 15, and the gap layer 22 that are made of each compound semiconductor material, are deposited in this order on the substrate 11.

In the lower barrier layer 13, a carrier supply layer 13a is provided. In the upper barrier layer 15, the p-type low resistance region 15d is provided together with the carrier supply layer 15a.

In addition, on the deposited body of each layer made of the compound semiconductor material described above, the insulating layer 17 is provided. On the insulating layer 17, openings 17a and 17b are provided. In the openings 17a and 17b, the source electrode 18 and the drain electrode 19 are formed, to be connected to the upper barrier layer 15 via the gap layer 22.

Between the openings 17a and 17b, openings 17c are provided in the insulating layer 17 and the gap layer 22. The openings 17c are continuously formed to the insulating layer 17 and the gap layer 22 beneath the insulating layer 17, and are formed in such a manner that the opening width of the gap layer 22 is larger than that of the insulating layer 17.

The above-described configuration is similar to the configuration in the first embodiment described above.

In the opening 17c, the gate insulating film 16 is formed on the upper barrier layer 15 along the bottom surface and the side surface of the opening 17c. The gate insulating film 16 is formed of a first gate insulating film 16A and a second gate insulating film 16B which is made of a different material from that of the first gate insulating film 16A.

On the gate insulating film 16, the gate electrode 20 is formed. The p-type low resistance region 15d is formed directly under the gate electrode 20 via the first gate insulating film 16A. Furthermore, the current block regions 21 are formed on the surface of the upper barrier layer 15 and beneath the gate insulating film 16 on both sides of the p-type low resistance region 15d. The current block regions 21 are provided at the position to be in contact with the second gate insulating film 16B and on the surface of the upper barrier layer 15.

The first gate insulating film 16A is provided beneath the gate electrode 20 only. In addition, the second gate insulating film 16B is provided on the side surface of the openings 17c except directly beneath the gate electrode 20. That is, in the semiconductor device in this example, two gate insulating films 16 made of different materials from each other are formed directly beneath the gate electrode 20 and on the side surfaces of the openings 17c respectively.

The interface state formed between the second gate insulating film 16B and the high resistance layer 15b is set so as to be in the deep state in the semiconductor and such that the density is higher, compared to the interface state formed between the first gate insulating film 16A and the p-type low resistance region 15d. For this reason, in the interface state formed between the second gate insulating film 16B and the high resistance layer 15b, the change of the depletion layer due to applying the voltage to the gate electrode is small. Therefore, even in a case where there are electrons between the p-type low resistance region 15d and the second gate insulating film 16B due to the inversion operation, the depletion layer can contribute as the current block region 21.

The examples of the insulating films having the functions of the second gate insulating film 16B include, for example, SiN and $SiO_2$. On the other hand, as the first gate insulating film 16A directly beneath the gate electrode 20, for example, $Al_2O_3$ and $HfO_2$ can be used.

Figure 13A:
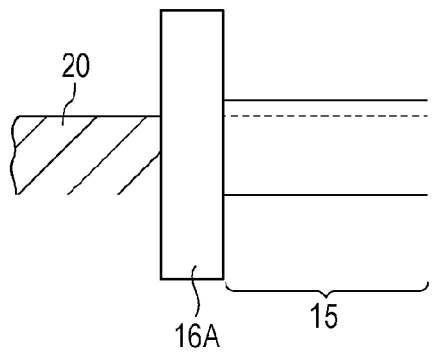
FIG. 13A is a diagram illustrating an energy band configuration in a case where an insulating film which does not have negative fixed charges is used beneath the gate electrode.
Figure 13B:
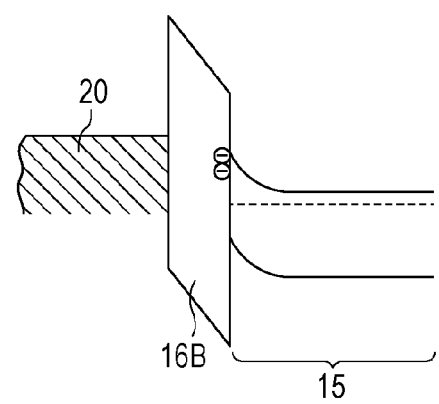
FIG. 13B is a diagram illustrating an energy band configuration in a case where an insulating film which has negative fixed charges is also present on the insulating film between the gate electrode and the source and drain electrode.

In addition, as the second gate insulating film 16B, the current block regions 21 may be formed by changing the amount of negative fixed charges and the amount of the interface dipole. FIG. 13A and FIG. 13B illustrate the change of the energy band configurations by the difference of the amount of the fixed charges of the material used in the gate insulating film 16. FIG. 13A illustrates an energy band configuration beneath the gate electrode 20 in a case where the gate insulating film 16 does not have the negative fixed charges. In addition, FIG. 13B illustrates an energy band configuration beneath the gate electrode 20 in a case where the gate insulating film 16 has the negative fixed charges.

As illustrated in FIG. 13B, by changing the amount of the fixed charges and the amount of the interface dipole, the voltage that can form the accumulation layer in the MIS interface can be shifted. For this reason, the electrons are not easily accumulated by $-Qf/Cox$, and the second gate insulating film 16B can contribute as the current block region 21. In this way, by changing the amount of the negative fixed charges and the amount of the interface dipole of the second gate insulating film 16B, it is possible to form the current block regions 21 on the upper interface of the second gate insulating film 16B and the upper barrier layer 15. As the insulating film introducing the fixed charges, for example, a material in which H is introduced to $Al_2O_3$ has been reported.

7. Fifth Embodiment (Semiconductor Device)

Next, a fifth embodiment of the semiconductor device will be described. The fifth embodiment is similar to the first embodiment described above. The semiconductor device in the fifth embodiment is the so-called MISJPHEMT in which the barrier layer is provided between the gate electrode and the channel layer, and the conduction type low resistance region that is different from the barrier layer is provided in the barrier layer. In addition, in the fifth embodiment, the same configuration as the above described first embodiment will be referenced by the same numerals, and the detailed description will not be repeated.

Figure 14:
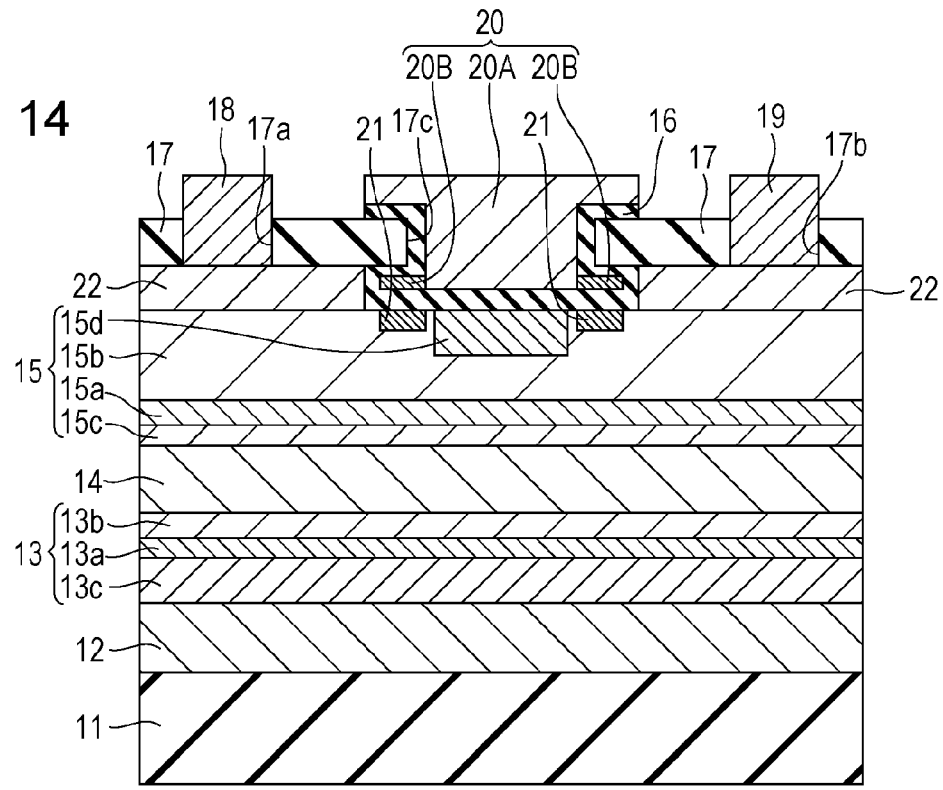
FIG. 14 is a diagram illustrating a schematic configuration of a semiconductor device according to a fifth embodiment.

The configuration of the semiconductor device in the fifth embodiment is illustrated in FIG. 14. As illustrated in FIG. 14, in the semiconductor device, the buffer layer 12, the lower barrier layer 13, the channel layer 14, the upper barrier layer 15, and the gap layer 22 that are made of each compound semiconductor material, are deposited in this order on the substrate 11.

In the lower barrier layer 13, the carrier supply layer 13a is provided. In the upper barrier layer 15, the p-type low resistance region 15d is provided together with the carrier supply layer 15a.

In addition, on the deposited body of each layer made of the compound semiconductor material described above, the insulating layer 17 is provided. On the insulating layer 17, the openings 17a and 17b are provided. In the openings 17a and 17b, the source electrode 18 and the drain electrode 19 are formed, to be connected to the upper barrier layer 15 via the gap layer 22.

Between the openings 17a and 17b, openings 17c are provided in the insulating layer 17 and the gap layer 22. The opening 17c is continuously formed to the insulating layer 17 and the gap layer 22 beneath the insulating layer 17, and is formed in such a manner that the opening of the gap layer 22 is larger than that of the insulating layer 17.

The above-described configuration is similar to the configuration in the first embodiment described above.

In addition, in the opening 17c, the gate insulating film 16 is formed on the upper barrier layer 15 along the bottom surface and the side surface of the opening 17c. In the opening 17c, the gate insulating film 16 on the side wall of the gap layer 22 and on the upper barrier layer 15 is formed to have a thickness thinner than that in the first embodiment. The configuration of this gate insulating film 16 is similar to that in the second embodiment described above.

In this example, on the upper part of the gate insulating film 16, the gate electrode 20 is formed. In addition, the gate electrode 20 is formed on the gate insulating film 16 of the opening 17c provided in the gap layer 22, in the wider range than the opening of the opening 17c provided in the insulating layer 17.

The gate electrode 20 is formed of a first gate electrode 20A and second gate electrodes 20B. The first gate electrode 20A is formed with the same width as the opening width of the opening 17c and in the same region as the p-type low resistance region 15d, in the center of the opening 17c. Then, the second gate electrodes 20B are provided on the side surfaces of the first gate electrode 20A. In the opening 17c, since the opening width of the gap layer 22 is formed to be wide, and the gate insulating film 16 is formed to be thin, the second gate electrode 20B is formed in the position where the opening width of the insulating layer 17 and the opening width of the gap layer 22 do not match. Then, the first gate electrode 20A is formed on the gate insulating film 16 except the region where the second gate electrode 20B is formed.

In addition, the p-type low resistance region 15d is formed directly under the first gate electrode 20A via the gate insulating film 16. Furthermore, the current block regions 21 are formed on the surface of the upper barrier layer 15 and directly under the second gate electrode 20B via the gate insulating film 16 on both sides of the p-type low resistance region 15d.

Figure 15A:
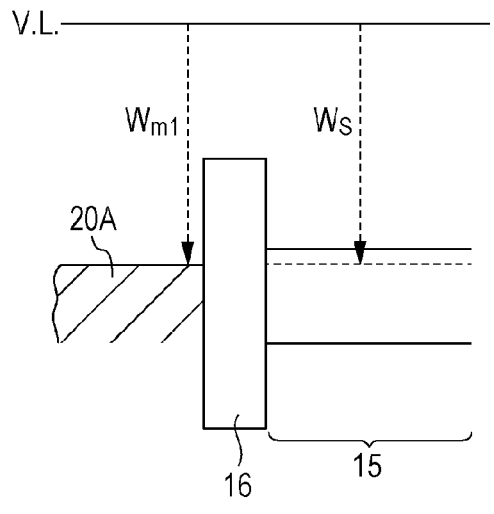
FIG. 15A is a diagram illustrating an energy band configuration of a gate metal, a gate insulating film, and a semiconductor layer in the gate electrode.
Figure 15B:
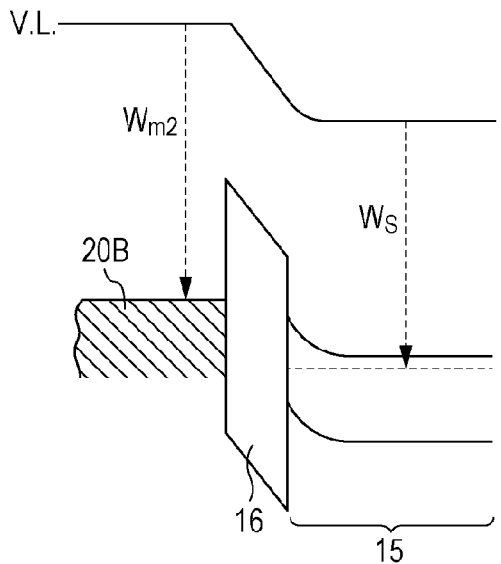
FIG. 15B is a diagram illustrating an energy band configuration in a case where a metal having a high work function with respect to the gate metal is in contact with the insulating film between the gate electrode and the source and drain electrode.

In the semiconductor device, a metal having a larger work function than that of the first gate electrode 20A is used as the second gate electrode 20B. FIG. 15A and FIG. 15B illustrate the change of the energy band configuration according to the difference of the work function of the metal used in the gate electrode 20. FIG. 15A and FIG. 15B illustrate the energy band configuration in the gate electrode 20 in a case where a material having a small work function ($W_{m1}$) is adopted to the gate electrode 20 and a case where a material having a large work function ($W_{m2}$) is adopted to the gate electrode 20.

As illustrated in FIG. 15A and FIG. 15B, by using the metal having a large work function, from the equation $\Delta V = W_{m2} - W_{m1}$, the electrons are not easily accumulated in the interface $\Delta V$, the voltage that forms the accumulation layer which is the current path is shifted to the positive bias direction. Therefore, in the MIS structure made of the second gate electrode 20B, the gate insulating film 16, and the high resistance layer 15b, the voltage applied to the gate due to the accumulation operation is shifted to the positive direction with respect to the MIS structure made of the first gate electrode 20A, the gate insulating film 16, and the p-type low resistance region 15d. For this reason, even when the latter MIS structure performs an inversion operation, the former MIS structure portion can maintain the functions as the current block region. In this way, by using the material having a large work function as the second gate electrode 20B, it is possible to form the current block regions 21 on the upper interface of the upper barrier layer 15.

As the examples of the metal having a large work function that realizes the function as the second gate electrode 20B, Ni, Pd, Pt, Au and the like can be included.

8. Sixth Embodiment (Semiconductor Device)

Next, a sixth embodiment of the semiconductor device will be described.

In each embodiment described above, the semiconductor device to which the current block regions based on the MISJPHEMT structure are introduced and a method of manufacturing thereof is described. However, the contribution of this current block region is not only effective to the MISJPHEMT but also effective to the MISPHEMT.

Hereinafter, the configuration in which the current block regions are introduced to the MISPHEMT structured semiconductor device will be described. In the MISPHEMT structured semiconductor device described in the sixth embodiment, the same configuration as in the MISJPHEMT structured semiconductor device described in the first embodiment above will be referenced by the same numerals, and the detailed description will not be repeated.

MISPHEMT

Figure 16:
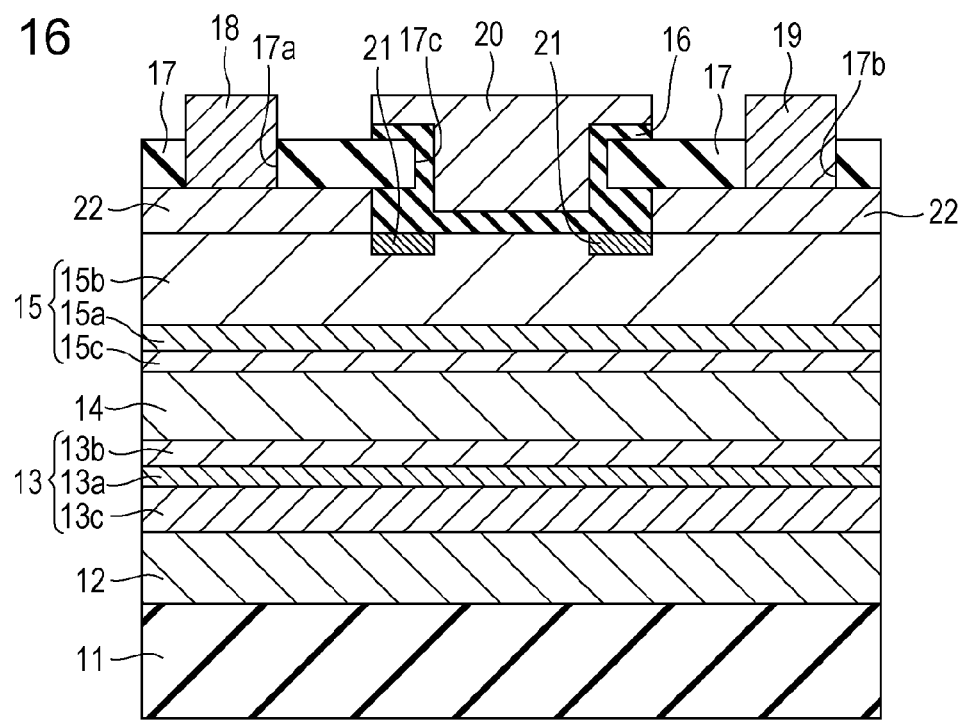
FIG. 16 is a diagram illustrating a schematic configuration of a semiconductor device according to a sixth embodiment.

The configuration of the semiconductor device in the sixth embodiment is illustrated in FIG. 16. As illustrated in FIG. 16, in the semiconductor device, the buffer layer 12, the lower barrier layer 13, the channel layer 14, the upper barrier layer 15, and the gap layer 22 that are made of each compound semiconductor material, are deposited in this order on the substrate 11.

In the lower barrier layer 13, a carrier supply layer 13a is provided. In the upper barrier layer 15, the carrier supply layer 15a is provided.

In addition, a p-type low resistance region is not provided in the upper barrier layer 15, unlike the MISJPHEMT structure described in the first embodiment.

Then, on the deposited body of each layer made of the compound semiconductor material described above, the insulating layer 17 is provided. On the insulating layer 17, the openings 17a and 17b are provided. In the openings 17a and 17b, the source electrode 18 and the drain electrode 19 are formed, to be connected to the upper barrier layer 15 via the gap layer 22.

Furthermore, between the openings 17a and 17b, openings 17c are provided in the insulating layer 17 and the gap layer 22. The opening 17c is continuously formed to the insulating layer 17 and the gap layer 22 beneath the insulating layer 17. The opening 17c is formed in such a manner that the opening width of the gap layer 22 is wider than that of the insulating layer 17.

In the opening 17c, the gate insulating film 16 is formed on the upper barrier layer 15 along the bottom surface and the side surface of the opening 17c. On the upper part of the gate insulating film 16, the gate electrode 20 is formed. The p-type low resistance region 15d is formed directly under the gate electrode 20 via the gate insulating film 16. Furthermore, the current block regions 21 are included on the surface of the upper barrier layer 15 and beneath the gate insulating film 16 except directly under the gate electrode 20.

In the sixth embodiment, the substrate 11, the buffer layer 12, the lower barrier layer 13, the channel layer 14, the gate insulating film 16, the insulating layer 17, the source electrode 18, the drain electrode 19, the gate electrode 20, and the gap layer 22 have similar configurations to those described in the first embodiment. In addition, the upper barrier layer 15 has a similar configuration to that described in the first embodiment except that the low resistance region is not included therein.

Current Block Regions

As illustrated in FIG. 16, in the interface between the gate insulating film 16 and the high resistance layer 15b, the current block regions 21 are formed on both sides directly under the gate electrode 20 except directly under the gate electrode 20.

In the semiconductor device having a configuration illustrated in FIG. 16, a Fermi level pinning occurs according to the interface state between the gate insulating film 16 and the high resistance layer 15b. That is, the depletion layer is generated in the high resistance layer 15b by the interface state between the gate insulating film 16 and the high resistance layer 15b of the upper barrier layer 15. In this way, the effect of the depletion layer being expanded in both sides of the gate electrode 20 is realized in a form of the current block region 21.

In the example, how the current block regions 21 are formed by the interface state can be described in a similar way to the configuration of the first embodiment, using the energy band configuration illustrated in FIG. 2A and FIG. 2B. As illustrated in FIG. 2A, in a case where the interface state density is low, the electrons are accumulated in the upper barrier layer 15 side by applying the voltage to the gate electrode. For this reason, the current path is generated in the interface between the gate insulating film 16 and the upper barrier layer 15. On the contrary, as illustrated in FIG. 2B, in a case where the interface state density is high, the electrons are not easily accumulated in the upper barrier layer 15 side even though the voltage is applied to the gate electrode. Therefore, the current path is not generated in the interface between the gate insulating film 16 and the upper barrier layer 15.

Since the current block regions 21 is the region with which the gate electrode 20 is not in contact, they are less susceptible to being affected by the voltage applied to the gate. Thus, even though the positive voltage is applied, the width of the depletion layer is not easily changed. Therefore, the effect of the current block region 21 is expected in the wide range of the gate voltage.

On the other hand, since the region of the current block region 21 directly under the gate electrode 20 is the region largely affected by the voltage applied to the gate, the width of the depletion layer to which the positive voltage is applied is easily changed, and it is difficult to expect the effect of the current block region. Therefore, the contribution of this region as the current block region is small.

Furthermore, the method of manufacturing the semiconductor device having the MISPHEMT structure described in the sixth embodiment is the same as in the method of manufacturing the semiconductor device in the first embodiment described above except that forming of the low resistance layer by introducing the impurities is not performed.

9. Seventh Embodiment (Semiconductor Device)

Next, a seventh embodiment of the semiconductor device will be described. The semiconductor device in the seventh embodiment is similar to that in the sixth embodiment described above, and is a so-called MISPHEMT in which the barrier layer between the gate electrode and the channel layer is included. In addition, in the seventh embodiment, the same configuration as the sixth embodiment described above will be referenced by the same numerals, and the detailed description will not be repeated.

Figure 17:
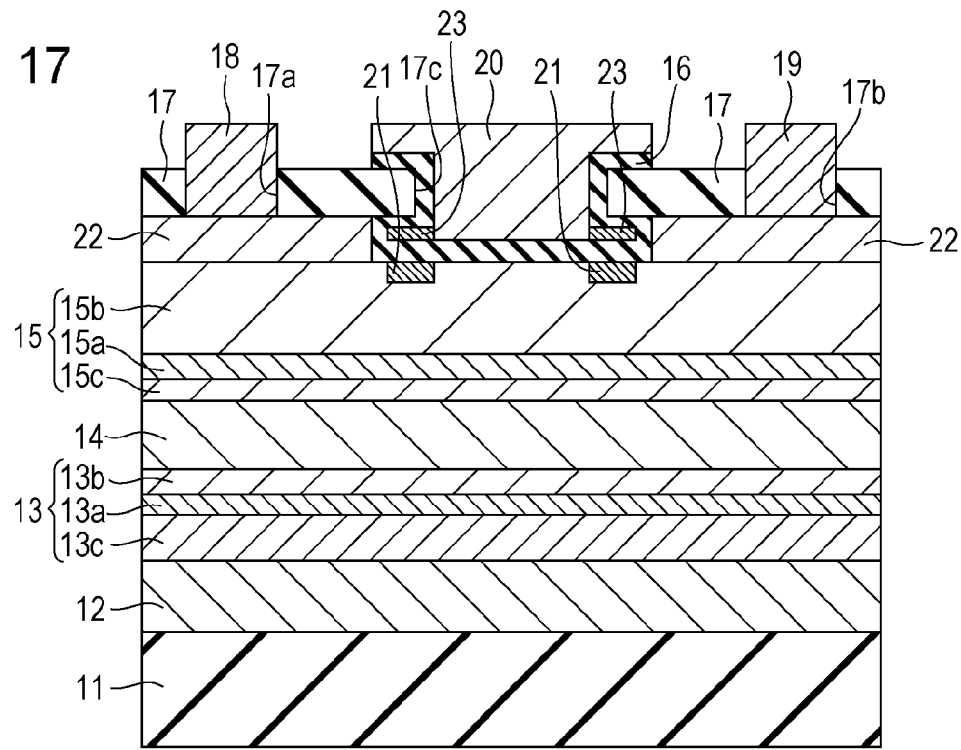
FIG. 17 is a diagram illustrating a schematic configuration of a semiconductor device according to a seventh embodiment.

The configuration of the semiconductor device in the seventh embodiment is illustrated in FIG. 17. As illustrated in FIG. 17, in the semiconductor device, the buffer layer 12, the lower barrier layer 13, the channel layer 14, the upper barrier layer 15, and the gap layer 22 that are made of each compound semiconductor material, are deposited in this order on the substrate 11.

In the lower barrier layer 13, a carrier supply layer 13a is provided. In the upper barrier layer 15, the carrier supply layer 15a is provided.

In addition, on the deposited body of each layer made of the compound semiconductor material described above, the insulating layer 17 is provided. On the insulating layer 17, the openings 17a and 17b are provided. In the openings 17a and 17b, the source electrode 18 and the drain electrode 19 are formed, to be connected to the upper barrier layer 15 via the gap layer 22.

Between the openings 17a and 17b, openings 17c are provided in the insulating layer 17 and the gap layer 22. The opening 17c is continuously formed in the insulating layer 17 and the gap layer 22 beneath the insulating layer 17. The opening 17c is formed in such a manner that the opening width of the gap layer 22 is wider than that of the insulating layer 17.

The configuration described above is similar to that in the sixth embodiment described above.

In the opening 17c, the gate insulating film 16 is formed on the upper barrier layer 15 along the bottom surface and the side surface of the opening 17c. In the opening 17c, the gate insulating film 16 on the side wall of the gap layer 22 and on the upper barrier layer 15 is formed to have a thickness thinner than half of the thickness of the gap layer 22. For this reason, the gap 23 surrounded by the gate insulating film 16 and the side surface of the gate electrode 20 is provided on the same layer as the gap layer 22.

The gate electrode 20 is provided on the upper part of the gate insulating film 16 except the gaps 23. Furthermore, the current block regions 21 are included on the surface of the upper barrier layer 15 and under the gap 23 on both sides of the gate electrode 20 and beneath the gate insulating film 16.

The gap 23 is formed between the gate insulating film 16 provided on the side wall of the gap layer 22 and the gate electrode 20, and above the current block regions 21. In the opening 17c, since the opening width of the gap layer 22 is wider than that of the insulating layer 17, the gap 23 is provided in the position where the opening widths do not match.

For this reason, the configuration is shown in which the gap 23 is provided on the side surface of the gate electrode 20. Since the gap 23 is provided between the gate electrode 20 and the current block regions 21, it is possible to further suppress the influence of the voltage applied to the gate on the current block regions via the gate insulating film, compared to the case in the first embodiment.

10. Eighth Embodiment (Semiconductor Device)

Next, an eighth embodiment of the semiconductor device will be described. The eighth embodiment is similar to the sixth embodiment described above. The semiconductor device in the eighth embodiment is the so-called MISPHEMT in which the barrier layer is included between the gate electrode and the channel layer. In addition, in the eighth embodiment, the same configuration as the above described sixth embodiment will be referenced by the same numerals, and the detailed description will not be repeated.

Figure 18:
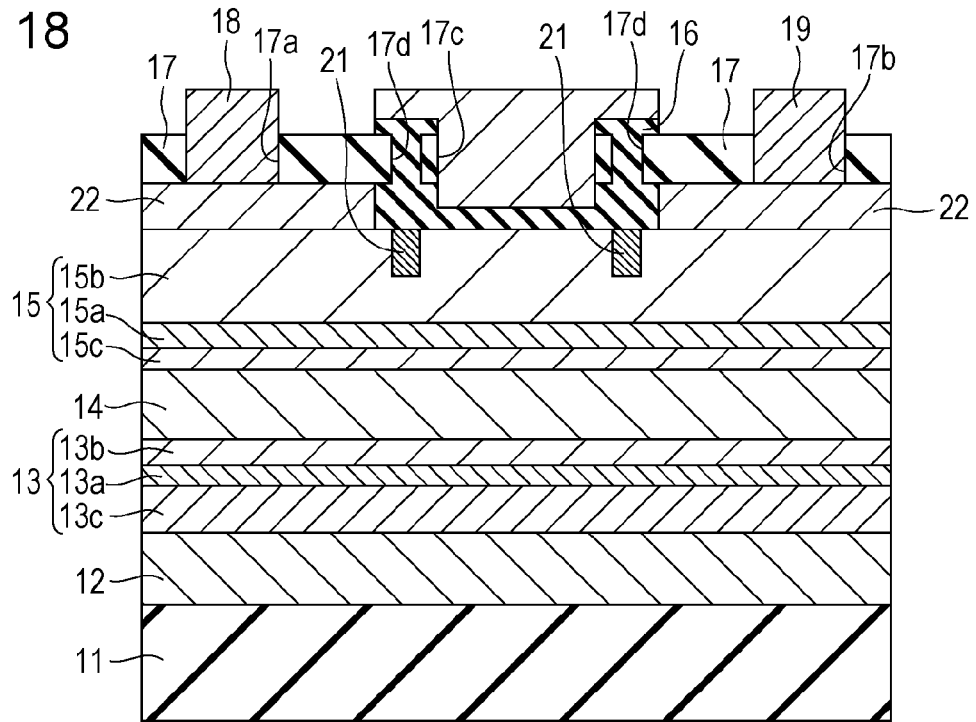
FIG. 18 is a diagram illustrating a schematic configuration of a semiconductor device according to an eighth embodiment.

The configuration of the semiconductor device in the eighth embodiment is illustrated in FIG. 18. As illustrated in FIG. 18, in the semiconductor device, the buffer layer 12, the lower barrier layer 13, the channel layer 14, the upper barrier layer 15, and the gap layer 22 that are made of each compound semiconductor material, are deposited in this order on the substrate 11.

In the lower barrier layer 13, a carrier supply layer 13a is provided. In the upper barrier layer 15, the carrier supply layer 15a is provided.

On the deposited body of the each layer made of the compound semiconductor material described above, the insulating layer 17 is provided. On the insulating layer 17, the openings 17a and 17b are provided. In the openings 17a and 17b, the source electrode 18 and the drain electrode 19 are formed, to be connected to the upper barrier layer 15 via the gap layer 22.

The above-described configuration is similar to the configuration in the sixth embodiment described above.

In addition, between the openings 17a and 17b, openings 17c and 17d are provided in the insulating layer 17 and the gap layer 22. The opening 17c is provided in the position of insulating layer 17 and the gap layer 22 where the gate electrode 20 is formed. The opening 17d is provided on both sides of the opening 17c with a predetermined interval from the opening 17c. An opening of the gap layer 22 is provided in the lower part of the insulating layer 17 so as to be connected with the opening 17c and the opening 17d in the same layer as the gap layer 22. Then, the gate insulating film 16 is continuously formed in the opening of the gap layer 22 from the opening 17d to the upper barrier layer 15. Furthermore, the gate electrode 20 is formed on the upper part of the gate insulating film 16 from the opening 17c.

Furthermore, on the surface of the high resistance layer 15b, the current block regions 21 are formed beneath the gate insulating film 16 below the opening 17d.

The current block regions 21 are formed by introducing the impurities to the high resistance layer 15b from the opening 17d. For example, the opening 17c is formed and the opening 17d is formed on both sides of the opening 17c after opening the insulating layer 17. Then, the current block regions 21 are formed beneath the opening 17d by introducing the impurities from the opening 17d. This region is made of the pn junction, and the depletion layer extended to the high resistance layer 15b side contributes as the current block region 21. Since the gate electrode 20 is not directly above the current block regions 21, and the voltage is applied thereto via the thick insulating film, the change of the depletion layer is small in the current block regions 21 at the time when the voltage is applied to the gate. For this reason, even when the gate voltage is applied, the depletion layer can contribute as the current block region.

11. Ninth Embodiment (Semiconductor Device)

Next, a ninth embodiment of the semiconductor device will be described. The semiconductor device in the ninth embodiment is similar to that in the sixth embodiment described above, and is the so-called MISPHEMT in which the barrier layer between the gate electrode and the channel layer is included. In addition, in the ninth embodiment, the same configuration as the sixth embodiment described above will be referenced by the same numerals, and the detailed description will not be repeated.

Figure 19:
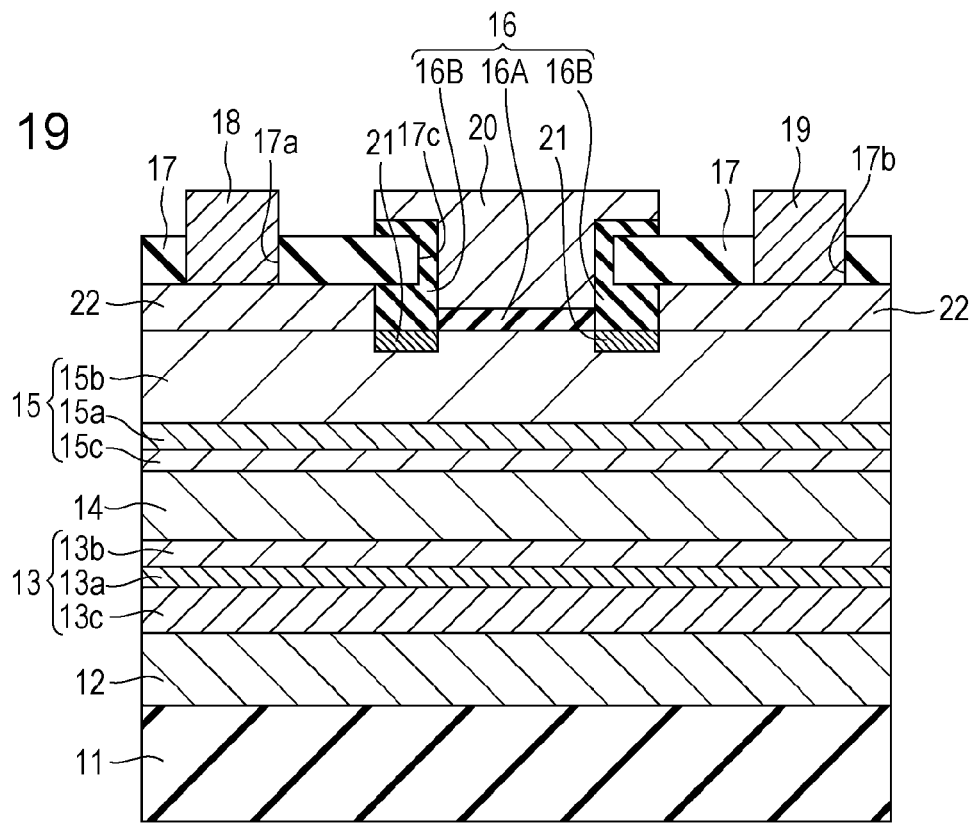
FIG. 19 is a diagram illustrating a schematic configuration of a semiconductor device according to a ninth embodiment.

The configuration of the semiconductor device in the ninth embodiment is illustrated in FIG. 19. As illustrated in FIG. 19, in the semiconductor device, the buffer layer 12, the lower barrier layer 13, the channel layer 14, the upper barrier layer 15, and the gap layer 22 that are made of each compound semiconductor material, are deposited in this order on the substrate 11.

In the lower barrier layer 13, a carrier supply layer 13a is provided. In the upper barrier layer 15, the carrier supply layer 15a is provided.

In addition, on the deposited body of each layer made of the compound semiconductor material described above, the insulating layer 17 is provided. On the insulating layer 17, the openings 17a and 17b are provided. In the openings 17a and 17b, the source electrode 18 and the drain electrode 19 are formed, to be connected to the upper barrier layer 15 via the gap layer 22.

Between the openings 17a and 17b, openings 17c are provided in the insulating layer 17 and the gap layer 22. The opening 17c is continuously formed in the insulating layer 17 and the gap layer 22 beneath the insulating layer 17. The opening 17c is formed in such a manner that the opening of the gap layer 22 is wider than that of the insulating layer 17.

The configuration described above is similar to that in the sixth embodiment described above.

In the opening 17c, the gate insulating film 16 is formed on the upper barrier layer 15 along the bottom surface and the side surface of the opening 17c. The gate insulating film 16 is formed of the first gate insulating film 16A and the second gate insulating film 16B which is made of a different material from that of the first gate insulating film 16A.

On the gate insulating film 16, the gate electrode 20 is formed. The p-type low resistance region 15d is formed directly under the gate electrode 20 via the first gate insulating film 16A. Furthermore, the current block regions 21 are included on the surface of the upper barrier layer 15 and beneath the gate insulating film 16 on both sides of the p-type low resistance region 15d. The current block regions 21 are provided at the position which is in contact with the second gate insulating film 16B and on the surface of the upper barrier layer 15.

The first gate insulating film 16A is provided beneath the gate electrode 20 only. In addition, the second gate insulating film 16B is provided on the side surface of the openings 17c except directly beneath the gate electrode 20. That is, in the semiconductor device in this example, two gate insulating films 16 made of different materials from each other are formed directly beneath the gate electrode 20 and on the side surface of the openings 17c respectively.

The interface state formed in the interface between the second gate insulating film 16B and the high resistance layer 15b is set so as to be in the deep state in the semiconductor and such that the density is higher, compared to the interface state formed between the first gate insulating film 16A and the high resistance layer 15b. For this reason, in the interface state formed in the interface between the second gate insulating film 16B and the high resistance layer 15b, the change of the depletion layer due to the voltage applied to the gate electrode is small. Therefore, even in a case where there are electrons between the high resistance layer 15b and the second gate insulating film 16B due to the inversion operation, the depletion layer can contribute as the current block region 21.

The examples of the insulating films having the functions of the second gate insulating film 16B include, for example, SiN and $SiO_2$. On the other hand, as the first gate insulating film 16A directly beneath the gate electrode 20, for example, $Al_2O_3$ and $HfO_2$ can be used.

In addition, for the second gate insulating film 16B, the current block regions 21 may be formed by changing the amount of the negative fixed charges and the amount of the interface dipole. The forming of the current block regions 21 by the difference of the amount of the fixed charges of the material used in the gate insulating film 16 can be described in a similar way to the fourth embodiment, using the energy band configuration illustrated in FIG. 13A and FIG. 13B.

As illustrated in FIG. 13B, by changing the amount of the fixed charges and the amount of the interface dipole, the voltage that can form the accumulation layer in the MIS interface can be shifted. For this reason, the electrons are not easily accumulated by −Qf/Cox, and the MIS accumulation layer can contribute as the current block region 21. In this way, by changing the amount of the negative fixed charges and the amount of the interface dipole of the second gate insulating film 16B, it is possible to form the current block regions 21 on the upper interface of the upper barrier layer 15. As the insulating film introducing the fixed charges, for example, a material in which H is introduced to $Al_2O_3$ has been reported.

12. Tenth Embodiment (Semiconductor Device)

Next, a tenth embodiment of the semiconductor device will be described. The tenth embodiment is similar to the sixth embodiment described above. The semiconductor device in the tenth embodiment is the so-called MISPHEMT in which the barrier layer is provided between the gate electrode and the channel layer. In addition, in the tenth embodiment, the same configuration as the above described sixth embodiment will be referenced by the same numerals, and the detailed description will not be repeated.

Figure 20:
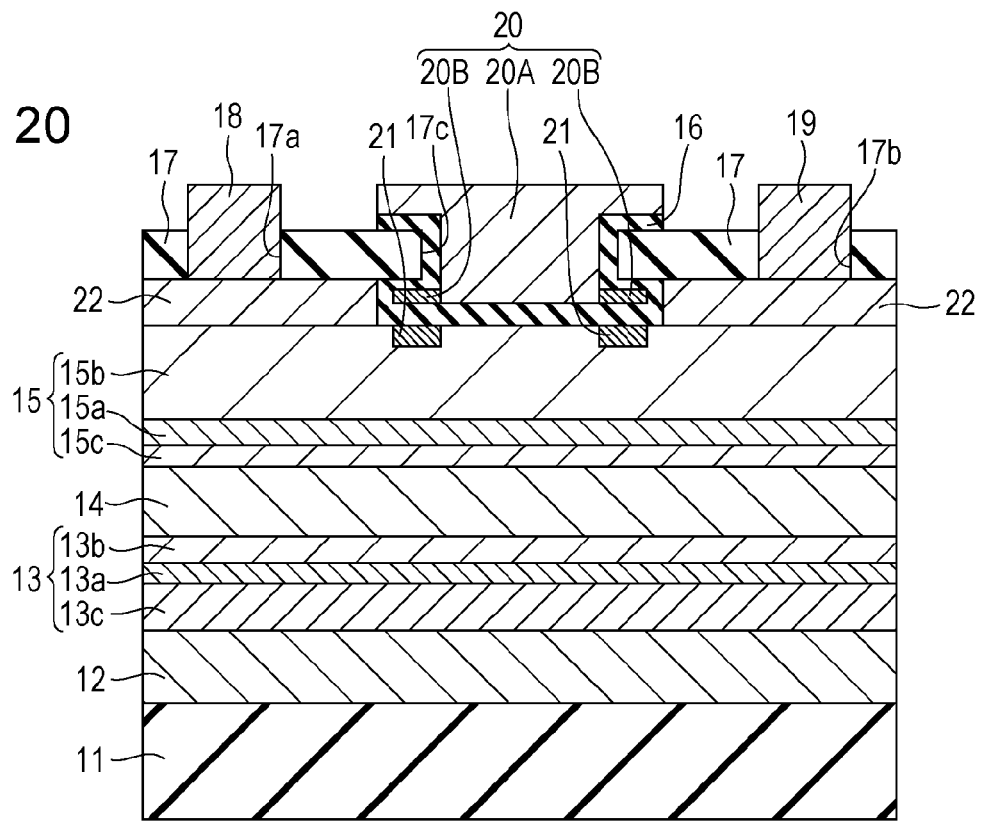
FIG. 20 is a diagram illustrating a schematic configuration of a semiconductor device according to a tenth embodiment.

The configuration of the semiconductor device in the tenth embodiment is illustrated in FIG. 20. As illustrated in FIG. 20, in the semiconductor device, the buffer layer 12, the lower barrier layer 13, the channel layer 14, the upper barrier layer 15, and the gap layer 22 that are made of each compound semiconductor material, are deposited in this order on the substrate 11.

In the lower barrier layer 13, a carrier supply layer 13a is provided. In the upper barrier layer 15, the carrier supply layer 15a is provided.

In addition, on the deposited body of each layer made of the compound semiconductor material described above, the insulating layer 17 is provided. On the insulating layer 17, the openings 17a and 17b are provided. In the openings 17a and 17b, the source electrode 18 and the drain electrode 19 are formed, to be connected to the upper barrier layer 15 via the gap layer 22.

Between the openings 17a and 17b, openings 17c are provided in the insulating layer 17 and the gap layer 22. The opening 17c is continuously formed in the insulating layer 17 and the gap layer 22 beneath the insulating layer 17, and is formed in such a manner that the opening of the gap layer 22 is wider than that of the insulating layer 17.

The above described configuration is similar to the configuration in the sixth embodiment described above.

In addition, in the opening 17c, the gate insulating film 16 is formed on the upper barrier layer 15 along the bottom surface and the side surface of the opening 17c. In the opening 17c, the gate insulating film 16 on the side wall of the gap layer 22 and on the upper barrier layer 15 is formed to have a thickness thinner than that in the sixth embodiment. The configuration of this gate insulating film 16 is similar to that in the seventh embodiment described above.

In this example, on the gate insulating film 16, the gate electrode 20 is formed. In addition, the gate electrode 20 is formed on the gate insulating film 16 of the opening 17c provided in the gap layer 22, in the wider range than the opening of the opening 17c provided in the insulating layer 17.

The gate electrode 20 is formed of a first gate electrode 20A and a second gate electrode 20B. The first gate electrode 20A is formed with the same width as the opening width of the opening 17c in the center of the opening 17c. Then, the second gate electrodes 20B are provided on the side surfaces of the first gate electrode 20A. In the opening 17c, since the opening width of the gap layer 22 is formed to be wide, and the gate insulating film 16 is formed to be thin, the second gate electrode 20B is formed in the position where the opening widths of the insulating layer 17 and the opening width of the gap layer 22 do not match. Then, the first gate electrode 20A is formed on the gate insulating film 16 except the region where the second gate electrode 20B is formed.

In addition, the current block regions 21 are included on the surface of the upper barrier layer 15 and directly under the second gate electrode 20B via the gate insulating film 16.

In the semiconductor device, the metal having a larger work function than that of the first gate electrode 20A is used for the second gate electrode 20B. The forming of the current block regions 21 by the difference of the work function of the metal used in the gate electrode 20 can be described in a similar way to the fifth embodiment, using the energy band configuration illustrated in FIG. 15B.

As illustrated in FIG. 15A and FIG. 15B, by using the metal having a large work function, from the equation $\Delta V = W_{m2} - W_{m1}$, the electrons are not easily accumulated in the interface $\Delta V$, and the voltage that forms the accumulation layer which is the current path is shifted to the positive bias direction. Therefore, in the MIS structure made of the second gate electrode 20B, the gate insulating film 16, and the high resistance layer 15b, the voltage applied to the gate due to the accumulation operation is shifted to the positive direction with respect to the MIS structure made of the first gate electrode 20A, the gate insulating film 16, and the high resistance layer 15b. For this reason, even when the latter MIS structure performs an inversion operation, the former MIS structure portion can maintain the functions as the current block regions 21. In this way, by using the material having a large work function as the second gate electrode 20B, it is possible to form the current block regions 21 on the upper interface of the upper barrier layer 15.

As the examples of the metal having a large work function that realizes the function as the second gate electrode 20B, Ni, Pd, Pt, Au and the like can be included.

13. Eleventh Embodiment (Semiconductor Device)

Next, an eleventh embodiment of the semiconductor device will be described.

In the sixth embodiment to the tenth embodiment described above, the semiconductor device to which the current block regions are introduced based on the MISPHEMT structure is described. However, the contribution of this current block region is effective in the structure in which the gate insulating film is in contact with the entire surface of the semiconductor surface.

Hereinafter, in the MISPHEMT structured semiconductor device having the current block regions, the configuration in which the gate insulating film is in contact with the semiconductor surface will be described. In the MISPHEMT structured semiconductor device described in the eleventh embodiment, the same configuration as in the MISJPHEMT structured semiconductor device described in the sixth embodiment above will be referenced by the same numerals, and the detailed description will not be repeated.

MISPHEMT

Figure 21:
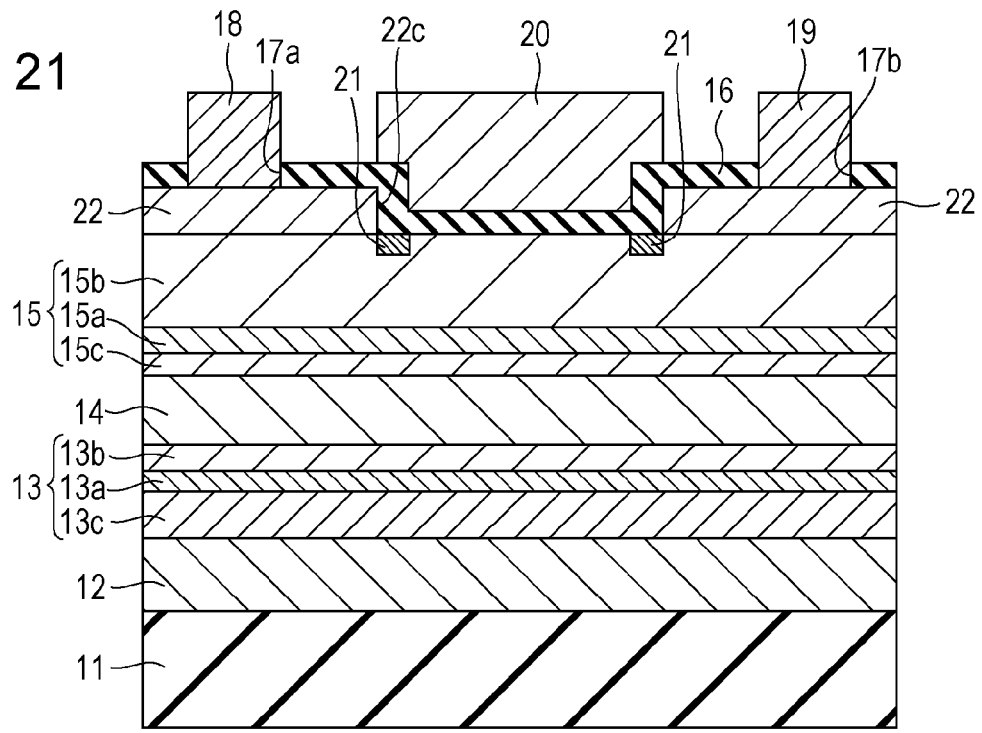
FIG. 21 is a diagram illustrating a schematic configuration of a semiconductor device according to an eleventh embodiment.

The configuration of the semiconductor device in the eleventh embodiment is illustrated in FIG. 21. As illustrated in FIG. 21, in the semiconductor device, the buffer layer 12, the lower barrier layer 13, the channel layer 14, the upper barrier layer 15, and the gap layer 22 that are made of each compound semiconductor material, are deposited in this order on the substrate 11.

In the lower barrier layer 13, a carrier supply layer 13a is provided. In the upper barrier layer 15, the carrier supply layer 15a is provided.

In addition, an opening 22c on which the gate electrode 20 is formed is provided in the gap layer 22.

Then, on the deposited body of each layer made of the compound semiconductor material described above, the gate insulating film 16 is provided to cover the upper part of the gap layer 22 and the upper part of the high resistance layer 15b which is exposed by the opening 22c of the gap layer 22. On the gate insulating film 16, the openings 17a and 17b are provided. In the openings 17a and 17b, the source electrode 18 and the drain electrode 19 are formed, to be connected to the upper barrier layer 15 via the gap layer 22. The opening 22c is provided between the opening 17a and the opening 17b. In the opening 22c, the gate electrode 20 is provided on the gate insulating film 16. Furthermore, the current block regions 21 are formed on the surface of the upper barrier layer 15 and beneath the gate insulating film 16 except directly under the gate electrode 20.

In the eleventh embodiment, the substrate 11, the buffer layer 12, the lower barrier layer 13, the channel layer 14, the source electrode 18, the drain electrode 19, the gate electrode 20, and the gap layer 22 have similar configurations to those described in the first embodiment. In addition, the upper barrier layer 15 has a similar configuration to that described in the sixth embodiment. The semiconductor device in this example has a similar configuration to that described in the sixth embodiment except that the insulating layer is not included on the gap layer 22 but the gate insulating film 16 is commonly included on the gap layer 22 and beneath the gate electrode 20.

Current Block Regions

As illustrated in FIG. 21, in the interface between the gate insulating film 16 and the high resistance layer 15b, the current block regions 21 are formed on both sides directly under the gate electrode 20 except directly under the gate electrode 20.

In the semiconductor device having a configuration illustrated in FIG. 21, a Fermi level pinning occurs according to the interface state between the gate insulating film 16 and the high resistance layer 15b. That is, the depletion layer is generated in the high resistance layer 15b by the interface state between the gate insulating film 16 and the high resistance layer 15b of the upper barrier layer 15. In this way, the effect of the depletion layer being expanded in both sides of the gate electrode 20 is realized in a form of the current block regions 21.

In the example, how the current block regions 21 are formed by the interface state can be described in a similar way to the first embodiment, using the energy band configuration illustrated in FIG. 2A and FIG. 2B. As illustrated in FIG. 2A, in a case where the interface state density is low, the electrons are accumulated in the upper barrier layer 15 side by applying the voltage to the gate electrode. For this reason, the current path is generated in the interface between the gate insulating film 16 and the upper barrier layer 15. On the contrary, as illustrated in FIG. 2B, in a case where the interface state density is high, the electrons are not easily accumulated in the upper barrier layer 15 side even though the voltage is applied to the gate electrode. Therefore, the current path is not generated in the interface between the gate insulating film 16 and the upper barrier layer 15.

Since the current block regions 21 are the regions with which the gate electrode 20 is not in contact, they are less susceptible to being affected by the voltage applied to the gate. Thus, even though the positive voltage is applied, the width of the depletion layer is not easily changed. Therefore, the effect of the current block region 21 is expected in the wide range of the voltage applied to the gate.

On the other hand, since the region of the current block regions 21 directly under the gate electrode 20 is largely affected by the voltage applied, the width of the depletion layer at the time when the positive voltage is applied is easily changed, and thus, it is difficult expect the effect of the current block region. Therefore, the contribution of this region as the current block region is not so large.

14. Twelfth Embodiment (Semiconductor Device)

Next, a twelfth embodiment of the semiconductor device will be described. The semiconductor device in the twelfth embodiment is similar to that in the eleventh embodiment described above, and is a so-called MISPHEMT having the configuration in which the gate insulating film is in contact with the entire surface of the semiconductor surface. In addition, in the twelfth embodiment, the same configuration as the eleventh embodiment described above will be referenced by the same numerals, and the detailed description will not be repeated.

Figure 22:
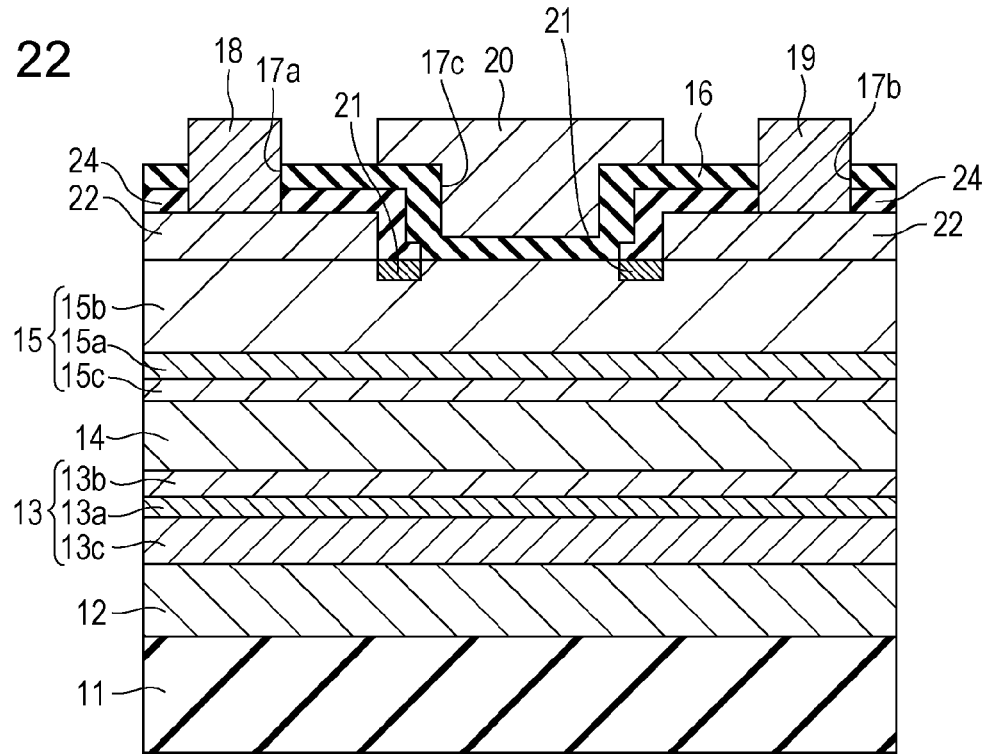
FIG. 22 is a diagram illustrating a schematic configuration of a semiconductor device according to a twelfth embodiment.

The configuration of the semiconductor device in the twelfth embodiment is illustrated in FIG. 22. As illustrated in FIG. 22, in the semiconductor device, the buffer layer 12, the lower barrier layer 13, the channel layer 14, the upper barrier layer 15, and the gap layer 22 that are made of each compound semiconductor material, are deposited in this order on the substrate 11.

In the lower barrier layer 13, a carrier supply layer 13a is provided. In the upper barrier layer 15, the carrier supply layer 15a is provided.

In addition, the opening 17c on which the gate electrode 20 is formed is provided in the gap layer 22.

Then, on the deposited body of each layer made of the compound semiconductor material described above, the insulating film 24 is provided to cover the upper part of the gap layer 22 and the upper part of the high resistance layer 15b which is exposed by the opening 17c of the gap layer 22, and on the region of the opening 17c except directly under gate electrode 20. Furthermore, the gate insulating film 16 is provided to cover the upper part of the insulating film 24 and the bottom surface of the opening 17c.

On the insulating film 24 and the gate insulating film 16, the openings 17a and 17b are provided. In the openings 17a and 17b, the source electrode 18 and the drain electrode 19 are formed, to be connected to the upper barrier layer 15 via the gap layer 22. The opening 17c is provided between the opening 17a and opening 17b. In the opening 17c, the gate electrode 20 is provided on the gate insulating film 16. Furthermore, the current block regions 21 are formed on the surface of the upper barrier layer 15 and beneath the insulating film 24.

The insulating film 24 and the gate insulating film 16 are formed of materials different from each other. The interface state formed between the insulating film 24 and the high resistance layer 15b is set so as to be in the deep state in the semiconductor and such that the density is higher, compared to the interface state formed between the gate insulating film 16 and the high resistance layer 15b. For this reason, in the interface state formed between the insulating film 24 and the high resistance layer 15b, the change of the depletion layer due to the voltage applied to the gate is small. Therefore, even in a case where there are electrons between the high resistance layer 15b and the insulating film 24 due to the inversion operation, the depletion layer can contribute as the current block region 21.

The examples of the insulating films having the functions of the insulating film 24 include, for example, SiN and $SiO_2$. On the other hand, as the gate insulating film 16 directly beneath the gate electrode 20, for example, $Al_2O_3$ and $HfO_2$ can be used.

In addition, as the insulating film 24, the current block regions 21 may be formed by changing the amount of the negative fixed charges and the amount of the interface dipole. The forming of the current block region 21 by the difference of the amount of the fixed charges of the material used in the gate insulating film 16 can be described in a similar way to the fourth embodiment, using the energy band configuration illustrated in FIG. 13A and FIG. 13B.

As illustrated in FIG. 13B, by changing the amount of the fixed charges and the amount of the interface dipole, the voltage that can form the accumulation layer in the MIS interface can be shifted. For this reason, the electrons are not easily accumulated by −Qf/Cox, and the MIS accumulation layer can contribute as the current block region 21. In this way, by changing the amount of the negative fixed charges and the amount of the interface dipole of the second gate insulating film 16B, it is possible to form the current block region 21 on the upper interface of the upper barrier layer 15. As the insulating film introducing the fixed charges, for example, a material in which H is introduced to $Al_2O_3$ has been reported.

As described in the embodiment, the configuration in which the gate insulating film is in contact with the entire surface of the semiconductor surface can be applied to the semiconductor device described in the first to tenth embodiments by the configuration in which the insulating layer on the gap layer and the gate insulating film is integrated.

15. Thirteenth Embodiment (Semiconductor Device)

Next, a thirteenth embodiment of the semiconductor device will be described.

In each embodiment described above, the structure in which the uppermost surface of the current block region is formed in the semiconductor layer opposing to the gate electrode via the gate insulating film. However, the uppermost surface of the current block region may be formed in the semiconductor layer which is different from the semiconductor layer opposing to the gate electrode.

Hereinafter, in the MISJPHEMT structured semiconductor device in the first embodiment, the configuration will be described in which the uppermost surface of the current block region is formed in the semiconductor layer which is different from the semiconductor layer opposing to the gate electrode. In the MISJPHEMT structured semiconductor device in the thirteenth embodiment, the same configuration as in the MISJPHEMT structured semiconductor device described in the first embodiment above will be referenced by the same numerals, and the detailed description will not be repeated.

Figure 23:
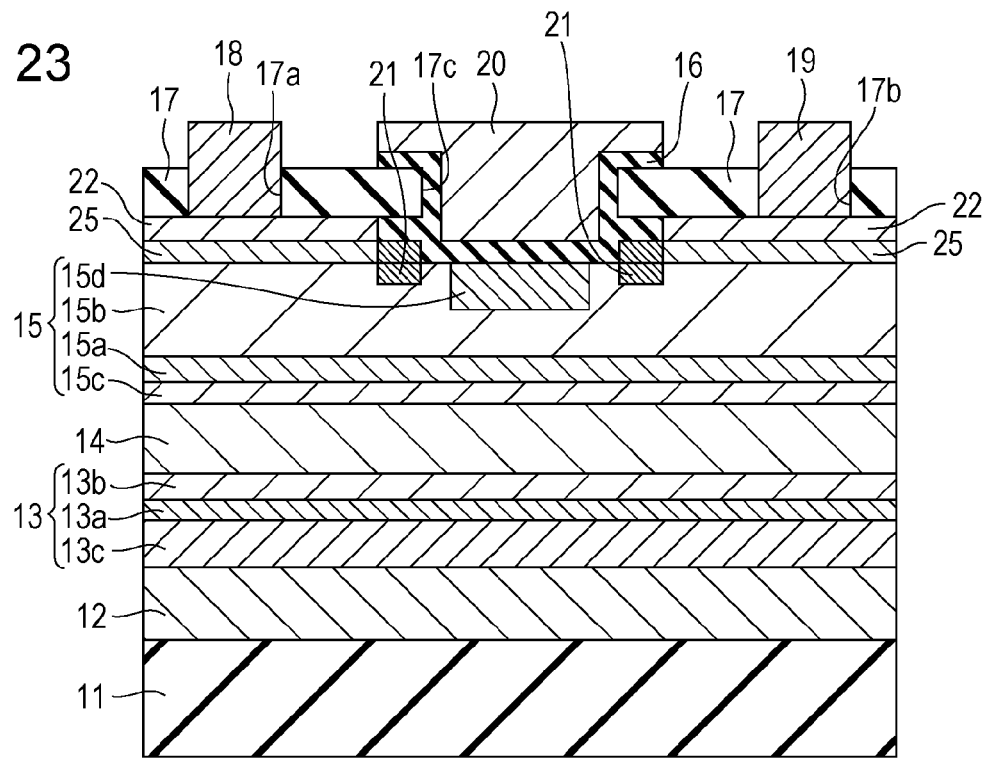
FIG. 23 is a diagram illustrating a schematic configuration of a semiconductor device according to a thirteenth embodiment.

The configuration of the semiconductor device in the thirteenth embodiment is illustrated in FIG. 23. As illustrated in FIG. 23, in the semiconductor device, the buffer layer 12, the lower barrier layer 13, the channel layer 14, the upper barrier layer 15, an interlayer layer 25, and the gap layer 22 that are made of each compound semiconductor material, are deposited in this order on the substrate 11.

In the lower barrier layer 13, a carrier supply layer 13a is provided. In the upper barrier layer 15, a p-type low resistance region 15d is provided together with the carrier supply layer 15a.

In addition, on the deposited body of each layer made of the compound semiconductor material described above, the insulating layer 17 is provided. On this insulating layer 17, the openings 17a and 17b are provided. In the openings 17a and 17b, the source electrode 18 and the drain electrode 19 are formed, to be connected to the upper barrier layer 15 via the gap layer 22 and the interlayer layer 25.

Furthermore, between the openings 17a and 17b, the opening 17c is provided in the insulating layer 17, the gap layer 22, and the interlayer layer 25. The opening 17c is formed continuously to the insulating layer 17, the gap layer 22, and the interlayer layer 25. The opening 17c is formed in such a manner that the opening width of the gap layer 22 is wider than that of the insulating layer 17, and the opening width of the interlayer layer 25 is the same as that of the insulating layer 17.

In the opening 17c, the gate insulating film 16 is formed on the upper barrier layer 15 along the bottom surface and the side surface of the opening 17c. On the upper part of the gate insulating film 16, the gate electrode 20 is formed. The p-type low resistance region 15d is formed directly under the gate electrode 20 via the gate insulating film 16. Furthermore, the current block region 21 is formed on the surface of the interlayer layer 25 which is in contact with the gate insulating film 16 and the position except directly under the gate electrode 20. The current block region 21 is formed from the surface of the interlayer layer 25 continuously to the high resistance layer 15b.

The interlayer layer 25 is formed using the material which has a higher interface state density formed in the interface with the gate insulating film 16, rather than the material adopted to the high resistance layer 15b. For example, that the interface state density of an InGaP based material, which is formed in the interface with the insulating film, is smaller than a GaAs based material is reported in Appl. Phys. Lett., 63, (1993) p. 379.

Therefore, in the semiconductor device in this example, the high resistance layer 15b of the upper barrier layer 15 is formed of the InGaP based material, and the interlayer layer 25 is formed of the AlGaAs based material. By this configuration, the interface state density in the interface between the gate insulating film 16 and the p-type low resistance region 15d can be made low, and further, the interface state density in the interface between the gate insulating film 16 and the interlayer layer 25 can be made high. Therefore, it is possible to form the current block region.

As described above, by interposing the interlayer layer 25 between the upper barrier layer 15 and the gate insulating film 16, the uppermost semiconductor layer on which the current block regions are formed and the semiconductor layer opposing to the gate electrode 20 via the gate insulating film 16 can be formed as different layers from each other. Then, by forming the uppermost semiconductor layer on which the current block regions are formed and the semiconductor layer opposing to the gate electrode via the gate insulating film from the different materials respectively, it is possible to achieve both of the reduction of the interface state density under the gate electrode and the current block region.

In this embodiment, the case of the configuration in which the interlayer layer 25 is interposed is applied to the semiconductor device in the first embodiment, is described. However, the configuration can also be applied to the semiconductor devices in the second to twelfth embodiments.

Conduction Type that is Different from the Barrier Layer

In the embodiments described above, the case of the configuration in which the carriers in the channel layer are electrons is described. However, the semiconductor device in the present disclosure can be applied to the case of the configuration in which the carriers are holes. The present disclosure can be applied to the case where the carriers are holes, by replacing the description of the conduction type of impurities and the energy band in the above-described embodiments with the conduction type that is different from the barrier layer.

The embodiments of the present disclosure can also have the configurations as follows.

(1) A semiconductor device including: a channel layer; a high resistance layer that is provided on the channel layer, and is made of a semiconductor with high resistance which has a conduction band position higher than that of a semiconductor which forms the channel layer; a first conduction-type low resistance region that is provided on a surface layer of the high resistance layer, and is made of a semiconductor which includes first conduction-type impurities; a source electrode and a drain electrode that are connected to the high resistance layer, in a position with the low resistance region interposed therebetween; a gate insulating film provided on the low resistance region; a gate electrode provided on the low resistance region via the gate insulating film; and current block regions that are formed between the low resistance region and the source electrode, and between the low resistance region and the drain electrode.

(2) The semiconductor device described in above (1), in which the current block regions are made of a depletion layer formed on the surface of the high resistance layer by an interface state which is formed in the high resistance layer and the gate insulating film.

(3) The semiconductor device described in above (2), further including: gaps in the gate insulating film on the current block regions.

(4) The semiconductor device described in above (2), further including: a metal layer that has a work function higher than that of the gate electrode, in the gate insulating film on the current block regions.

(5) The semiconductor device described in above (1), in which the current block regions are made of a diffusion region of the first conduction-type impurities.

(6) The semiconductor device described in above (1), in which an insulating film which is different from the gate insulating film is provided on the current block regions.

(7) The semiconductor device described in above (1) to (6), in which surface layers of the current block regions are formed of semiconductor layers which are different from the high resistance layer.

(8) The semiconductor device described in above (7), including: an interlayer layer between the high resistance layer and the gate insulating film except the position directly under the gate electrode, in which the current block regions are formed in the interface of the gate insulating film and the interlayer layer from the surface of the interlayer layer.

(9) A semiconductor device including: a channel layer; a high resistance layer that is provided on the channel layer, and is made of a semiconductor with high resistance which has a conduction band position higher than that of the semiconductor which forms the channel layer; a source electrode and a drain electrode that are connected to the high resistance layer; a gate insulating film provided on the high resistance layer; a gate electrode provided on the high resistance layer between the source electrode and the drain electrode via the gate insulating film; and current block regions formed between the source electrode and the drain electrode except the position directly under the gate electrode.

(10) A method of manufacturing a semiconductor device, including: forming a high resistance layer that is made of a semiconductor with high resistance which has conduction band position higher than that of a semiconductor which forms the channel layer, on the channel layer; forming a first conduction type low resistance region that is made of a semiconductor which includes a first conduction type impurities, on a surface layer of the high resistance layer; forming a source electrode and a drain electrode that are connected to the high resistance layer in a position with the low resistance region interposed therebetween; forming a gate insulating film on the low resistance region; forming a gate electrode on the low resistance region via the gate insulating film; and forming current block regions between the low resistance region and the source electrode, and between the low resistance region and the drain electrode.

(11) A method of manufacturing a semiconductor device, including: forming a high resistance layer that is made of a semiconductor with high resistance which has a conduction band position higher than that of a semiconductor which forms a channel layer, on the channel layer; forming a source electrode and a drain electrode that are connected to the high resistance layer; forming a gate insulating film on the high resistance layer; forming a gate electrode on the high resistance region between the source electrode and the drain electrode via the gate insulating film; and forming current block regions between the source electrode and the drain electrode except the position directly under the gate electrode.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a channel layer;
   a high resistance layer on the channel layer, and made of a semiconductor with high resistance which has a conduction band position higher than that of a semiconductor which forms the channel layer;
   a first conduction-type low resistance region on a surface layer of the high resistance layer, and made of a semiconductor which includes first conduction-type impurities;
   a source electrode and a drain electrode that are connected to the high resistance layer, in positions with the low resistance region interposed therebetween;
   a gate insulating film on the low resistance region;
   a gate electrode on the low resistance region with the gate insulating film therebetween; and
   current block regions that are between the low resistance region and the source electrode, and between the low resistance region and the drain electrode.

2. The semiconductor device according to claim 1, wherein the current block regions are made of a depletion layer formed on the surface of the high resistance layer by an interface state which is formed in the high resistance layer and the gate insulating film.

3. The semiconductor device according to claim 2, further comprising
gaps in the gate insulating film on the current block regions.

4. The semiconductor device according to claim 2, further comprising:
a metal layer that has a work function higher than that of the gate electrode, and is in the gate insulating film on the current block regions.

5. The semiconductor device according to claim 1,
wherein the current block regions are made of a diffusion region of the first conduction-type impurities.

6. The semiconductor device according to claim 1,
wherein an insulating film which is different from the gate insulating film is provided on the current block regions.

7. The semiconductor device according to claim 1,
wherein surface layers of the current block regions are formed of semiconductor layers which are different from the high resistance layer.

8. The semiconductor device according to claim 7, comprising
an interlayer layer between the high resistance layer and the gate insulating film except at a position directly under the gate electrode,
wherein the current block regions are formed in the interface of the gate insulating film and the interlayer layer from the surface of the interlayer layer.

9. A semiconductor device comprising:
a channel layer;
a high resistance layer on the channel layer, and made of a semiconductor with high resistance which has a conduction band position higher than that of a semiconductor which forms the channel layer;
a source electrode and a drain electrode that are connected to the high resistance layer;
a gate insulating film on the high resistance layer;
a gate electrode on the high resistance layer between the source electrode and the drain electrode with the gate insulating film therebetween; and
current block regions between the source electrode and the drain electrode except at a position directly under the gate electrode.

10. A method of manufacturing a semiconductor device, comprising:
forming on a channel layer a high resistance layer that is made of a semiconductor with high resistance which has conduction band position higher than that of a semiconductor which forms the channel layer;
forming a first conduction type low resistance region that is made of a semiconductor which includes a first conduction type impurities, on a surface layer of the high resistance layer;
forming a source electrode and a drain electrode that are connected to the high resistance layer in positions with the low resistance region interposed therebetween;
forming a gate insulating film on the low resistance region;
forming a gate electrode on the low resistance region via the gate insulating film; and
forming current block regions between the low resistance region and the source electrode, and between the low resistance region and the drain electrode.

11. A method of manufacturing a semiconductor device, comprising:
forming on a channel layer a high resistance layer that is made of a semiconductor with high resistance which has a conduction band position higher than that of a semiconductor which forms the channel layer;
forming a source electrode and a drain electrode that are connected to the high resistance layer;
forming a gate insulating film on the high resistance layer;
forming a gate electrode on the high resistance region between the source electrode and the drain electrode with the gate insulating film therebetwen; and
forming current block regions between the source electrode and the drain electrode except at a position directly under the gate electrode.

* * * * *